United States Patent
Kondoh et al.

(10) Patent No.: US 11,495,566 B2
(45) Date of Patent: Nov. 8, 2022

(54) CORE MATERIAL, ELECTRONIC COMPONENT AND METHOD FOR FORMING BUMP ELECTRODE

(71) Applicant: SENJU METAL INDUSTRY CO., LTD., Tokyo (JP)

(72) Inventors: Shigeki Kondoh, Tokyo (JP); Masato Tsuchiya, Tokyo (JP); Hiroyuki Iwamoto, Tokyo (JP); Hiroshi Okada, Tokyo (JP); Daisuke Souma, Tokyo (JP)

(73) Assignee: SENJU METAL INDUSTRY CO., LTD., Tokyo (JP)

( * ) Notice: Subject to any disclaimer, the term of this patent is extended or adjusted under 35 U.S.C. 154(b) by 0 days.

(21) Appl. No.: 17/472,032

(22) Filed: Sep. 10, 2021

(65) Prior Publication Data

US 2022/0077093 A1 Mar. 10, 2022

(30) Foreign Application Priority Data

Sep. 10, 2020 (JP) .............................. JP2020-151742

(51) Int. Cl.
*H01L 23/00* (2006.01)

(52) U.S. Cl.
CPC .............. *H01L 24/13* (2013.01); *H01L 24/11* (2013.01); *H01L 2224/11849* (2013.01); *H01L 2224/13147* (2013.01); *H01L 2224/13582* (2013.01); *H01L 2224/13583* (2013.01); *H01L 2224/13611* (2013.01); *H01L 2224/13655* (2013.01); *H01L 2224/13657* (2013.01); *H01L 2924/014* (2013.01); *H01L 2924/01005* (2013.01); *H01L 2924/01015* (2013.01); *H01L 2924/0133* (2013.01)

(58) Field of Classification Search
CPC ....................................................... H01L 24/13
See application file for complete search history.

(56) References Cited

U.S. PATENT DOCUMENTS

| 5,573,859 | A | 11/1996 | Suppelsa | |
| 10,096,923 | B2 * | 10/2018 | Oda | ........................ C22C 5/06 |

(Continued)

FOREIGN PATENT DOCUMENTS

| CN | 102672365 | 9/2012 |
| CN | 107877029 | 4/2018 |

(Continued)

OTHER PUBLICATIONS

Notice of Reasons for Refusal dated Jan. 27, 2021 in Japanese Application No. 2020-151742, with English translation.

(Continued)

*Primary Examiner* — William A Harriston
(74) *Attorney, Agent, or Firm* — Wenderoth, Lind & Ponack, L.L.P.

(57) ABSTRACT

A core material has a core; a solder layer provided outside the core and being a solder alloy containing Sn and at least any one element of Ag, Cu, Sb, Ni, Co, Ge, Ga, Fe, Al, In, Cd, Zn, Pb, Au, P, S, Si, Ti, Mg, Pd, and Pt; and a Sn layer provided outside the solder layer. The solder layer has a thickness of 1 μm or more on one side. The Sn layer has a thickness of 0.1 μm or more on one side. A thickness of the Sn layer is 0.215% or more and 36% or less of the thickness of the solder layer.

7 Claims, 1 Drawing Sheet

(56) References Cited

U.S. PATENT DOCUMENTS

| | | | | |
|---|---|---|---|---|
| 2006/0055054 | A1* | 3/2006 | Kondo | H05K 3/3436 |
| | | | | 257/E23.021 |
| 2007/0084904 | A1* | 4/2007 | Sumikawa | H05K 3/3436 |
| | | | | 228/101 |
| 2015/0251278 | A1* | 9/2015 | Lee | B23K 35/0244 |
| | | | | 174/250 |
| 2015/0380373 | A1* | 12/2015 | Moon | H01L 24/17 |
| | | | | 257/738 |
| 2016/0244891 | A1* | 8/2016 | Son | B23K 35/0244 |
| 2017/0266765 | A1* | 9/2017 | Zhang | B23K 35/262 |
| 2017/0274478 | A1* | 9/2017 | Nozaka | C25D 5/40 |
| 2017/0312860 | A1* | 11/2017 | Hattori | B23K 35/302 |
| 2018/0015572 | A1* | 1/2018 | Kawasaki | C25D 3/60 |
| 2018/0174991 | A1* | 6/2018 | Nishino | B23K 35/262 |
| 2018/0281118 | A1* | 10/2018 | Kawasaki | B23K 35/3033 |
| 2018/0358288 | A1* | 12/2018 | Lee | H01L 24/20 |
| 2019/0375053 | A1* | 12/2019 | Kawasaki | B23K 35/302 |
| 2019/0376161 | A1* | 12/2019 | Kawasaki | C22C 9/00 |

FOREIGN PATENT DOCUMENTS

| | | |
|---|---|---|
| JP | 2007-75856 | 3/2007 |
| JP | 3924552 | 3/2007 |
| JP | 5367924 | 12/2013 |
| JP | 5773106 | 9/2015 |
| JP | 6217836 | 10/2017 |
| JP | 2019-76928 | 5/2019 |
| KR | 101049520 | 7/2011 |
| KR | 10-2015-0075684 | 7/2015 |
| KR | 10-1563884 | 10/2015 |
| KR | 10-2016-0103922 | 9/2016 |
| TW | 1648416 | 1/2019 |
| WO | 2015/114798 | 8/2015 |

OTHER PUBLICATIONS

Decision to Grant a Patent dated Apr. 19, 2021 in Japanese Application No. 2020-151742, with English translation.

Extended European Search Report dated Feb. 2, 2022 in European Patent Application No. 21195017.5.

Office Action dated Jan. 25, 2022 in Taiwanese Patent Application No. 110130842.

International Search Report dated May 20, 2022 and Written Opinion dated May 23, 2022 in Singapore Application No. 10202109969Y.

* cited by examiner

CORE MATERIAL, ELECTRONIC COMPONENT AND METHOD FOR FORMING BUMP ELECTRODE

TECHNICAL FIELD

The present embodiment relates to a core material, an electronic component having a bump using this core material, and a method for forming a bump electrode.

The present application claims the priority of Japanese Patent Application No. 2020-151742 filed on Sep. 10, 2020, the contents of which are entirely incorporated by reference.

BACKGROUND ART

In recent years, with development of a small information device, size of an electronic component mounted on the information device is rapidly being reduced. A ball grid array (BGA) with an electrode disposed on a rear surface of the BGA is applied as the electronic component in order to correspond to narrowing a connection terminal and reducing mounting area according to a demand for miniaturization.

An example of the electronic component to which the BGA is applied includes a semiconductor package. The semiconductor package is configured by sealing a semiconductor chip having an electrode with a resin. A solder bump is formed on the electrode of the semiconductor chip. The solder bump is formed by bonding a solder ball to the electrode of the semiconductor chip. The semiconductor package to which the BGA is applied is mounted on a printed circuit board by bonding the solder bump melted by heating to a conductive land of the printed circuit board. In recent years, in order to meet the demand for higher-density mounting, a three-dimensional high-density mounting in which semiconductor packages are stacked in a height direction has also been developed.

When the semiconductor package obtained with the three-dimensional high-density mounting is the BGA and the solder ball is placed on the electrode of the semiconductor chip and reflowed, the solder ball may be crushed due to weight of the semiconductor package itself. When such a situation occurs, there is a problem that the solder extrudes from electrodes to bring the electrodes into contact with each other, and a short-circuit between the electrodes is caused.

In order to prevent such a short-circuit from occurring, a solder bump that is not crushed due to the weight of the semiconductor package itself and is not deformed when the solder is melted is proposed as a solder ball. Specifically, it is proposed to use a ball molded of metal or a resin as a core, and to use a core material obtained by coating the core with a solder as a solder bump.

Japanese Patent No. 5367924 discloses a solder bump in which a Cu ball is used as a core and a Sn-based solder alloy formed of Sn and Bi is plated on the Cu ball. A plating treatment is performed at a concentration gradient in which a content of Bi contained in a solder plating layer in Japanese Patent No. 5367924 is high on an inner side (inner circumferential side) and is lower as being directed toward an outer side (outer circumferential side).

As in Japanese Patent No. 5367924, when a solder is heated and melted in a state in which a concentration of Bi in the solder plating layer is high on the inner circumferential side and is low on the outer circumferential side, a density of Bi on the inner circumferential side is high. Therefore, the solder begins to be melted from a Bi region on the inner circumferential side. Even when the Bi region on the inner circumferential side is melted, the Bi region on the outer circumferential side has yet to begin to be melted. Therefore, a volume expansion in the Bi region on the inner circumferential side occurs early. Due to a slow volume expansion on the inner and outer circumferential sides, a situation occurs in which a pressure difference is generated between the inner circumferential side and the outer circumferential side (outside air) of Bi, and the pressure difference due to the volume expansion on the inner circumferential side causes the Cu ball, which is a core, to burst open when the outer circumferential side of Bi begins to be melted. The occurrence of the situation has to be avoided. As described above, a defect has been generated in a Cu core ball having a solder plating layer formed of the Sn-based solder alloy formed of Sn and Bi when Bi in the solder plating layer has a concentration gradient.

Japanese Patent No. 6217836 is proposed in order to solve the above-described problems caused in Japanese Patent No. 5367924. In Japanese Patent No. 6217836, in a core material having a solder plating layer formed by plating a (Sn—Bi)-based solder alloy formed of Sn and Bi on a core surface, the core material is provided in which Bi contained in the solder plating layer is distributed in a concentration ratio within a predetermined range of 91.4% to 106.7% in the solder plating layer.

SUMMARY OF INVENTION

Problem to be Solved by Invention

When a relatively large amount of Ag and Cu are contained in the surface of the solder plating layer, Ag and Cu are locally discolored to black, and the appearance is mottled, which may cause deteriorated appearance quality. As a result of the color becoming black from the viewpoint of yellowness, the yellowness increases, which may cause defect determination in appearance inspection.

As described above, when a relatively large amount of Ag and Cu are contained in the surface of the solder plating layer, the solder plating layer easily reacts with a sulfur component of the plating liquid and oxygen in the air. As a result, oxidation easily proceeds, which tends to easily cause an increased oxide film thickness. When the oxide film thickness increases as described above, dissolution behavior at the time of substrate reflow deteriorates, which may cause a state (ball missing) where the solder ball is detached from the electrode pad or positional deviation.

The present invention provides a core material and so on that is unlikely to be determined to be defective in a visual inspection and can prevent the oxide film thickness from increasing and suppress a bonding defect.

Solution to Problem

[Concept 1]

A core material may comprise:

a core;

a solder layer provided outside the core and being a solder alloy containing Sn and at least any one element of Ag, Cu, Sb, Ni, Co, Ge, Ga, Fe, Al, In, Cd, Zn, Pb, Au, P, S, Si, Ti, Mg, Pd, and Pt; and a Sn layer provided outside the solder layer, wherein the solder layer may have a thickness of 1 μm or more on one side, the Sn layer may have a thickness of 0.1 μm or more on one side, and a thickness of the Sn layer may be 0.215% or more and 36% or less of the thickness of the solder layer.
[Concept 2]
In the core material according to concept 1, the solder layer may be a (Sn—Ag—Cu)-based solder.
[Concept 3]
The core material, according to concept 1 or 2, may further comprise a base plating layer made of any one of Ni, Co, Ni—Co, Ni—P and Ni—B between the core and the solder layer.
[Concept 4]
In the core material according to any one of concepts 1 to 3, Cu ball or Cu column may be used as the core.
[Concept 5]
An electronic component may use the core material according to any one of concepts 1 to 4 as a solder bump.
[Concept 6]
A method for forming bump electrode may comprise steps of:
mounting the core material according to any one of concepts 1 to 4 on an electrode;
forming a bump electrode by heating the mounted core material.

According to the present invention, a core material and so on that is unlikely to be determined to be defective in a visual inspection and can prevent the oxide film thickness from increasing and suppress a bonding defect can be provided.

EMBODIMENT FOR CARRYING OUT INVENTION

Figure 1:
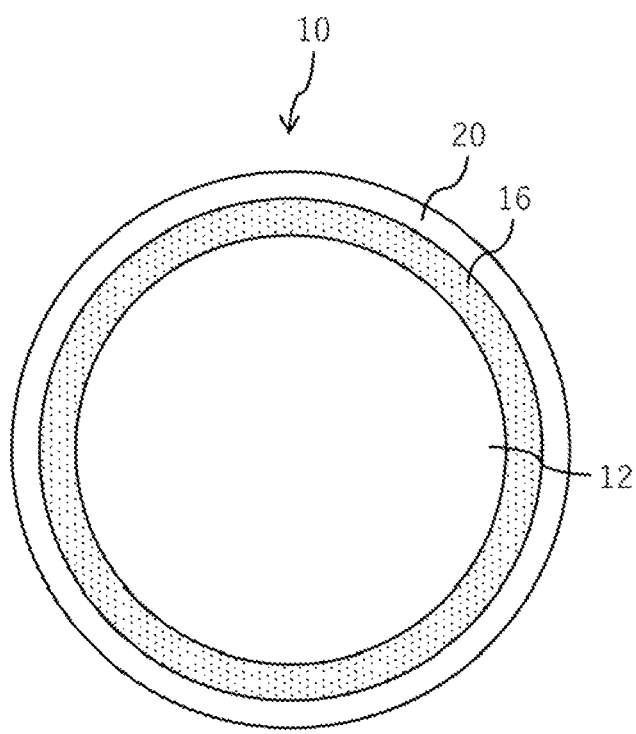
FIG. 1 is a cross-sectional view illustrating an example of a Cu core ball according to an embodiment of the present invention.

Hereinafter, preferred embodiments of the present embodiment will be described in detail. In the embodiment, a core material and an electronic component including a semiconductor package using the core material are provided.

The core material of the present embodiment may include a core; a solder layer provided outside the core and being a solder alloy containing Sn and at least any one element of Ag, Cu, Sb, Ni, Co, Ge, Ga, Fe, Al, In, Cd, Zn, Pb, Au, P, S, Si, Ti, Mg, Pd, and Pt; and a Sn layer provided outside the solder layer. The thickness of the solder layer may be 1 μm or more on one side. The thickness of the Sn layer is considered to be 0.1 to 12 μm on one side, but the upper limit value thereof may exceed 12 μm as long as the thickness of the Sn layer is 0.215% or more and 36% or less of that of the solder layer.

The Sn layer may be formed to have a thickness of preferably 0.26% or more and 33.3% or less of that of the solder layer. In the present embodiment, as an example, a solder plating layer is described as the solder layer to be used, and a Sn plating layer is described as the Sn layer to be used, but the present invention is not limited thereto. The solder layer may be formed by a method other than plating, and similarly, the Sn layer may be formed by a method other than plating. The Sn layer may contain a component other than Sn as an impurity such as Ag, Cu, Bi, Sb, Ni, Co, Ge, Ga, Fe, Al, In, Cd, Zn, Pb, Au, P, S, or Si.

The solder alloy may be a Sn-based solder alloy. The Sn-based solder alloy can include other additive elements in addition to (Sn—Ag)-based and (Sn—Cu)-based solder alloys. The element that can be added to the (Sn—Ag)-based and (Sn—Cu)-based solder alloys is one or two or more elements of Ag, Cu, Ni, Bi, Ge, Ga, In, Zn, Fe, Pb, Sb, Au, Pd, and Co and the like. For example, a (Sn—Ag—Cu—Ni)-based solder alloy and a (Sn—Ag—Sb)-based solder alloy and the like are considered. A Pb-based solder alloy may be used; the content (main component) of Pb may be the largest in mass; a (Pb—Sn)-based solder alloy may be used; and the content of Pb may be more than that of Sn. In Examples to be described later, SAC 305 (Ag 3.0 Cu 0.5 Sn balance), SnAg (Ag 3.5 Sn balance), SnCu (Cu 0.7 Sn balance), SnSb (Sb 10 Sn balance), SnIn (In 45 Sn balance), and SnPb (Pb 37 Sn balance) are used, but the present invention is not limited thereto. For example, for SAC, the content of Ag and the content of Cu may be changed, and Ag 0.1 Cu 0.1 Sn balance to Ag 10 Cu 10 Sn balance may be used. For SnAg, Ag 0.1 Sn balance to Ag 10 Sn balance may be used by changing the content of Ag. For SnCu, Cu 0.1 Sn balance to Cu1Sn balance may be used by changing the content of Cu. For SnSb, Sb 0.1 Sn balance to Sb 15 Sn balance may be used by changing the content of Sb. For SnIn, In 0.1 Sn balance to In 95 Sn balance may be used by changing the content of In. For SnPb, Pb 0.1 Sn balance to Pb 95 Sn balance may be used by changing the content of Pb. In the present application, the numerical value of the addition amount of each element is represented by % by mass. For example, "Ag 3.0 Cu 0.5 Sn balance" indicates that 3.0% by mass of Ag and 0.5% by mass of Cu are contained, the balance being Sn.

The Sn plating layer is formed after the solder plating layer is formed. As an example, a solder plating layer containing Sn and at least any one element of Ag, Cu, Sb, Ni, Co, Ge, Ga, Fe, Al, In, Cd, Zn, Pb, Au, P, S, Si, Ti, Mg, Pd, and Pt on the core is formed. The core material on which the solder plating layer is formed may be pulled up from a molten liquid containing Sn and at least any one element of Ag, Cu, Sb, Ni, Co, Ge, Ga, Fe, Al, In, Cd, Zn, Pb, Au, P, S, Si, Ti, Mg, Pd, and Pt, and then immersed in a molten liquid of Sn to form the Sn plating layer. Both the solder plating layer and the Sn plating layer may be formed using barrel electroplating. Electroless plating may be used as a plating method.

When the Sn plating layer is not provided, and the solder plating layer contains 0.1% by mass or more of a component other than Sn, the problem of discoloration occurs. When the Sn plating layer is not provided, and the solder plating layer is 100% by mass of Sn, the problem of discoloration does not occur, but the problem of discoloration is confirmed to occur when the solder plating layer is made of the following components. In the case of electroplating, if Ag or the like remains in the plating liquid just before the end of solder plating, substitution deposition-based discoloration of the surface is considered to occur.

Ag 0.05 Cu 0.05 Sn balance, discolored
Ag 0.1 Sn balance, discolored
Cu 0.1 Sn balance, discolored
Sb 0.1 Sn balance, discolored
In 0.1 Sn balance, discolored
Pb 0.1 Sn balance, discolored Metal or a resin is conceivable as the core, and a shape of the core is conceivable to be a sphere or other shape (columnar column, sheet shape, and the like). In the embodiment, a case of a Cu core ball which is a sphere and uses a ball which is, particularly, formed of Cu as the core (also referred to as "Cu ball") will be described. The Cu core ball in the embodiment only needs to contain Cu in the core, and other configurations are not particularly limited.

A particle diameter (sphere diameter) of the core differs depending on size of the BGA, but in the following example, the core has a spherical shape of about 300 μmφ and a thickness of the solder plating layer on one side in a diameter direction is 1 μm to 100 μm. A thickness of the Sn plating layer on one side in the diameter direction may be determined based on the thickness of the solder plating layer, and as described above the thickness of the Sn plating layer on one side in the diameter direction is 0.215% or more and 36% or less of the thickness of the solder plating layer, preferably 0.26% or more and 33.3% or less of the thickness of the solder plating layer. The particle diameter of the Cu core ball is appropriately selected according to a density and size of the electronic components to be used. Therefore, the core having the particle diameter in a range of 1 μm to 1000 μm can be used, and the plating thickness can be appropriately selected according to the particle diameter of the core to be used. A typical particle diameter when being used as a ball is 200 μm to 300 μm. When the particle diameter is further minimized in the future, a mainstream particle diameter may be 100 μm to 160 μm, and the present application can be used without any problem even with this particle diameter. As a plating apparatus that performs the plating treatment, an electroplating apparatus may be used.

Figure 2:
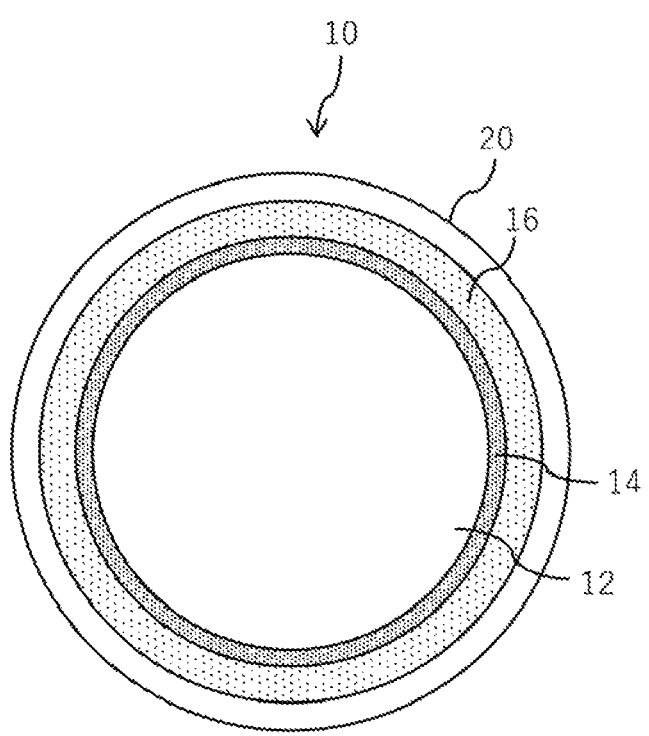
FIG. 2 is a cross-sectional view illustrating another example of a Cu core ball according to an embodiment of the present invention.

Subsequently, an example of the Cu core ball using the Cu ball as a core will be described. FIGS. 1 and 2 are cross-sectional views illustrating an example of a Cu core ball 10 according to the embodiment of the present invention.

As illustrated in FIG. 2, in the Cu core ball 10, a core 12 containing Cu and a solder plating layer 16 formed of the solder alloy are formed via a Ni base plating layer 14 in the example, and a Sn plating layer 20 is formed on the solder plating layer 16. The Ni base plating layer 14 functions as a base plating (functions as a barrier layer) for preventing a composition change of the solder plating layer 16 due to a metal diffusion between the core 12 and the solder plating layer 16, and a thickness of the Ni base plating layer 14 on one side is about 1 μm to 4 μm. The Ni base plating layer 14 is not an indispensable requirement, and the solder plating layer 16 can be formed directly on the surface of the core 12 as illustrated in FIG. 1 When forming the base plating layer 14, the base plating layer 14 may be configured of a layer formed of one element or more selected from the group consisting of Ni, Co, P and B. More specifically, the base plating layer made of any one of Ni, Co, Ni—Co, Ni—P and Ni—B may be provided.

Cu used in the core 12 may be pure copper or an alloy of copper.

When the core 12 having an alloy composition containing Cu as a main component is used, purity of Cu is not particularly limited, but from a viewpoint of suppressing deterioration of electric conductivity and thermal conductivity of the Cu core ball due to a decrease in purity and suppressing α-rays as necessary, the purity of Cu is preferably 99.9% by mass or more.

The core may be formed of a metal simple substance of Ni, Ag, Bi, Pb, Al, Sn, Fe, Zn, In, Ge, Sb, Co, Mn, Au, Si, Pt, Cr, La, Mo, Nb, Pd, Ti, Zr, Mg, an alloy made from two or more of these components, a metal oxide, or a metal mixture oxide in addition to Cu, and may be formed of a resin material. As the resin material, a resin material formed of an amino resin, an acrylic resin, an ethylene-vinyl acetate resin, a styrene-butadiene block copolymer, a polyester resin, a melamine resin, a phenol resin, an alkyd resin, a polyimide resin, a urethane resin, an epoxy resin, a cross-linked resin, or the like is exemplified. Of these, it is preferable to use conductive plastic such as polyacetylene, polypyrrole, polythiophene, and polyaniline. When the core is formed of the resin material, the Cu core ball can be formed by a resin core, a Cu plating layer coating an outer side of the resin core, a base plating layer such as Ni coating a surface of the Cu plating layer, and a solder plating layer coating a surface of the base plating layer. A laminated structure of the Cu core ball is not limited to the above example.

When the core 12 is spherical, from a viewpoint of controlling a stand-off height, sphericity of the core 12 is preferably 0.95 or more, and more preferably 0.990 or more. When the sphericity of the core 12 is less than 0.95, the core 12 has an indefinite shape. Therefore, a bump having a height which is not uniform is formed at the time of forming the bump, and the possibility of causing defective bonding increases. Further, when the Cu core ball 10 is mounted on the electrode and reflowed, and the sphericity is low, the Cu core ball 10 is misaligned and a self-alignment property deteriorates.

Here, the sphericity represents a deviation from the sphere. The sphericity is obtained by various methods such as a least squares center method (LSC method), a minimum zone center method (MZC method), a maximum inscribed center method (MIC method), and a minimum circumscribed center method (MCC method). Specifically, the sphericity is an arithmetic average value calculated when the diameter of each of 500 cores is divided by a long diameter, and the closer the value is to the upper limit of 1.00, the closer to the sphere. The length of the long diameter is a length measured by ULTRA QV350-PRO measurement device (ultra quick vision manufactured by MITUTOYO CORPORATION).

It is preferable that the diameter of the entire Cu core ball 10 including the solder plating layer 16 is 1 μm to 1000 μm. Within this range, the spherical Cu core ball 10 can be stably manufactured, and by selecting the particle diameter, it is possible to suppress a connection short circuit when there is a narrow pitch between the electrode terminals.

The solder plating layer 16 is made of a solder alloy, and includes Sn and at least any one element of Ag, Cu, Sb, Ni, Co, Ge, Ga, Fe, Al, In, Cd, Zn, Pb, Au, P, S, Si, Ti, Mg, Pd, and Pt in the present embodiment.

The thickness of the solder plating layer 16 varies depending on the particle diameter of the core 12, but the thickness of the solder plating layer 16 on one side in the diameter direction is preferably 100 μm or less. For example, when the core 12 has a particle diameter of 300 μmφ, the solder plating layer 16 is formed so as to have a thickness of 1 μm to 100 μm on one side. This is for securing a sufficient amount of solder bonding.

As the plating liquid, a known plating liquid can be appropriately used according to the solder composition to be formed.

EXAMPLE

Hereinafter, the embodiment will be described in detail with reference to Examples and Comparative Examples. The embodiment is not limited to these Examples.

As an evaluation of the core ball having a composition shown in each Table which will be described later, an evaluation of yellowness and an evaluation of a defect at the time of bonding were performed based on the following criteria.

<Yellowness>

The yellowness of the core ball was measured by using a CM-2600d spectrophotometer manufactured by KONICA MINOLTA. The yellowness of 8.5 or less in the L*a*b* table color system was set to "Good" and indicated as "○" in each Table. The yellowness of more than 8.5 in the L*a*b* table color system was determined to be "defective" and indicated as "x" in each Table.

<Defect at the Time of Bonding>

Ten core balls (samples) having a composition in each Example and each Comparative Example, which are produced in the same production batch as each sample of which yellowness was measured, were prepared, and each core ball was bonded to a substrate by normal reflow processing. Regarding defects at the time of bonding, a case where a bonding defect was not measured in all the ten samples was indicated as "Good" and indicated as "○" in each Table. On the other hand, a case where misalignment or a ball missing is caused at the time of bonding in even one sample or a case where a core bursts open as the time of bonding in even one sample was determined to be "defective", and indicated as "x" in Table.

Core balls 10 in Examples and Comparative Examples were prepared under the following conditions.

Diameter of core 12: 300 μm

Film thickness of Ni base plating layer 14: 2 μm on one side

Film thickness of solder plating layer 16: 1 μm on one side, 18 μm or 38 μm on one side Diameter of core ball 10 excluding Sn plating layer 20: 306 μm, 340 μm or 380 μm As a method for plating the Ni base plating layer 14, an electroplating method (barrel electroplating) was used for a sample having a core made of Cu. An electroless plating method was used for a sample having a core made of a resin. Aluminum as a core was subjected to a double zincate treatment for a sample having a core made of aluminum. Ni plating was thinly applied to the treated aluminum by an electroless plating method, and the Ni plating was then grown to a desired thickness by an electroplating method.

The solder plating layer 16 was plated by an electroplating method (barrel electroplating).

The Sn plating layer 20 was formed by pulling up the core ball including the solder plating layer 16 from a molten liquid containing Sn, Ag and Cu, Cu, Ag, Sb, In or Pb, and then immersing the core ball in a molten liquid of Sn. More specifically, the sample on which the solder plating layer 16 was formed was taken out from a plating liquid containing Sn, Ag and Cu, Cu, Ag, Sb, In or Pb, washed, and dried.

After that, the sample was put into a plating liquid containing methane sulfonic acid Sn, an organic acid and a surfactant, and the barrel electroplating was performed until the sample has the thickness of the Sn plating layer 20 described in each Example and each Comparative example (excluding Comparative example in which the Sn plating layer 20 is not formed).

In the following Table 1, aspects in which copper is used as the material of the core and the solder layer composition is made of SAC 305 are shown as Examples 1 to 9. Also in the following Table 2, aspects in which copper is used as the material of the core and the solder layer composition is made of SAC 305 are shown as Comparative Examples 1 to 9. In Examples 1 to 3 and Comparative Examples 1 to 3, the thickness of the solder layer on one side is 18 μm, but the thicknesses of the Sn layer one side are different from each other. In Examples 4 to 6 and Comparative Examples 4 to 6, the thickness of the solder layer one side is 38 μm, but the thicknesses of the Sn layer on one side are different from each other. In Examples 7 to 9 and Comparative Examples 7 to 9, the thickness of the solder layer on one side is 1 μm, but the thicknesses of the Sn layer on one side are different from each other. The "Sn layer: solder layer" shown in each Table is calculated by an expression of Sn layer thickness (one side)/solder layer (one side)×100, and is a value obtained by dividing the thickness of the Sn layer on one side by the thickness of the solder layer on one side, and expressed in %. It has the same meaning in the other Tables. The phrase "less than the lower limit value" shown in Tables of Comparative Examples means that the thickness of the Sn layer is less than 0.215% of that of the solder layer, and the phrase "exceeding the upper limit value" shown in Tables of Comparative Examples means that the thickness of the Sn layer exceeds 36% of that of the solder layer. These have the same meanings in the other Tables. In all of Examples 1 to 9, good results could be confirmed to be obtained in each of yellowness and a defect at the time of bonding. Meanwhile, in all of Comparative Examples 1 to 9, any of yellowness and the time of bonding could be confirmed to be poor. In particular, it could be confirmed that when the Sn layer is not provided or when the thickness of the Sn layer is less than 0.215% of that of the solder layer, a problem in yellowness occurs. Meanwhile, it could be confirmed that when the thickness of the Sn layer exceeds 36% of that of the solder layer, a defect at the time of bonding occurs.

TABLE 1

| | EXAMPLE 1 | EXAMPLE 2 | EXAMPLE 3 | EXAMPLE 4 | EXAMPLE 5 | EXAMPLE 6 | EXAMPLE 7 | EXAMPLE 8 | EXAMPLE 9 |
|---|---|---|---|---|---|---|---|---|---|
| CORE MATERIAL | COPPER | COPPER | COPPER | COPPER | COPPER | COPPER | COPPER | COPPER | COPPER |
| THICKNESS OF SOLDER LAYER | 18 μm ON ONE SIDE | 18 μm ON ONE SIDE | 18 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |
| COMPOSITION OF SOLDER LAYER | SAC305 | SAC305 | SAC305 | SAC305 | SAC305 | SAC305 | SAC305 | SAC305 | SAC305 |
| THICKNESS OF Sn LAYER (μm) | 0.1 | 0.5 | 6 | 0.1 | 0.5 | 12 | 0.1 | 0.23 | 0.36 |
| Sn LAYER:SOLDER LAYER | 0.556 | 2.778 | 33.333 | 0.263 | 1.316 | 31.573 | 10.000 | 23.000 | 36.000 |
| YELLOWNESS | ○ | ○ | ○ | ○ | ○ | ○ | ○ | ○ | ○ |
| DEFECT AT THE TIME OF BONDING | ○ | ○ | ○ | ○ | ○ | ○ | ○ | ○ | ○ |

TABLE 2

|  | COMPARATIVE EXAMPLE 1 | COMPARATIVE EXAMPLE 2 | COMPARATIVE EXAMPLE 3 | COMPARATIVE EXAMPLE 4 | COMPARATIVE EXAMPLE 5 | COMPARATIVE EXAMPLE 6 | COMPARATIVE EXAMPLE 7 | COMPARATIVE EXAMPLE 8 | COMPARATIVE EXAMPLE 9 |
|---|---|---|---|---|---|---|---|---|---|
| CORE MATERIAL | COPPER | COPPER | COPPER | COPPER | COPPER | COPPER | COPPER | COPPER | COPPER |
| THICKNESS OF SOLDER LAYER | 18 μm ON ONE SIDE | 18 μm ON ONE SIDE | 18 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |
| COMPOSITION OF SOLDER LAYER | SAC305 | SAC305 | SAC305 | SACS 05 | SAC305 | SAC305 | SAC305 | SAC305 | SAC305 |
| THICKNESS OF Sn LAYER (μm) | 0 | 0.03 | 10 | 0 | 0.03 | 15 | 0 | 0.002 | 0.5 |
| Sn LAYER:SOLDER LAYER | 0.000 0:100 | 0.167 LESS THAN LOWER LIMIT VALUE | 55.556 EXCEEDING UPPER LIMIT VALUE | 0.000 0:100 | 0.079 LESS THAN LOWER LIMIT VALUE | 39.474 EXCEEDING UPPER LIMIT VALUE | 0.000 0:100 | 0.200 LESS THAN LOWER LIMIT VALUE | 50.000 EXCEEDING UPPER LIMIT VALUE |
| YELLOWNESS | X | X | ○ | X | X | ○ | X | X | ○ |
| DEFECT AT THE TIME OF BONDING | ○ | ○ | X | ○ | ○ | X | ○ | ○ | X |

In the following Table 3, aspects in which copper is used as the material of the core and the solder layer composition is made of SnCu (Cu 0.7 Sn balance) are shown as Examples 10 to 18. Also in the following Table 4, aspects in which copper is used as the material of the core and the solder layer composition is made of SnCu are shown as Comparative Examples 10 to 18. In Examples 10 to 12 and Comparative Examples 10 to 12, the thickness of the solder layer on one side is 18 μm, but the thicknesses of the Sn layer on one side are different from each other. In Examples 13 to 15 and Comparative Examples 13 to 15, the thickness of the solder layer on one side is 38 μm, but the thicknesses of the Sn layer on one side are different from each other. In Examples 16 to 18 and Comparative Examples 16 to 18, the thickness of the solder layer on one side is 1 μm, but the thicknesses of the Sn layer on one side are different from each other. In all of Examples 10 to 18, good results could be confirmed to be obtained in each of yellowness and a defect at the time of bonding. Meanwhile, in all of Comparative Examples 10 to 18, any of yellowness and the time of bonding could be confirmed to be poor. In particular, it could be confirmed that when the Sn layer is not provided or when the thickness of the Sn layer is less than 0.215% of that of the solder layer, a problem in yellowness occurs. Meanwhile, it could be confirmed that when the thickness of the Sn layer exceeds 36% of that of the solder layer, a defect at the time of bonding occurs.

TABLE 3

|  | EXAMPLE 10 | EXAMPLE 11 | EXAMPLE 12 | EXAMPLE 13 | EXAMPLE 14 | EXAMPLE 15 | EXAMPLE 16 | EXAMPLE 17 | EXAMPLE 18 |
|---|---|---|---|---|---|---|---|---|---|
| CORE MATERIAL | COPPER | COPPER | COPPER | COPPER | COPPER | COPPER | COPPER | COPPER | COPPER |
| THICKNESS OF SOLDER LAYER | 18 μm ON ONE SIDE | 18 μm ON ONE SIDE | 18 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |
| COMPOSITION OF SOLDER LAYER | SnCu | SnCu | SnCu | SnCu | SnCu | SnCu | SnCu | SnCu | SnCu |
| THICKNESS OF Sn LAYER (μm) | 0.1 | 0.5 | 6 | 0.1 | 0.5 | 12 | 0.1 | 0.23 | 0.36 |
| Sn LAYER:SOLDER LAYER | 0.556 | 2.778 | 33.333 | 0.263 | 1.316 | 31.579 | 10.000 | 23.000 | 36.000 |
| YELLOWNESS | ○ | ○ | ○ | ○ | ○ | ○ | ○ | ○ | ○ |
| DEFECT AT THE TIME OF BONDING | ○ | ○ | ○ | ○ | ○ | ○ | ○ | ○ | ○ |

TABLE 4

|  | COMPARATIVE EXAMPLE 10 | COMPARATIVE EXAMPLE 11 | COMPARATIVE EXAMPLE 12 | COMPARATIVE EXAMPLE 13 | COMPARATIVE EXAMPLE 14 | COMPARATIVE EXAMPLE 15 | COMPARATIVE EXAMPLE 16 | COMPARATIVE EXAMPLE 17 | COMPARATIVE EXAMPLE 18 |
|---|---|---|---|---|---|---|---|---|---|
| CORE MATERIAL | COPPER | COPPER | COPPER | COPPER | COPPER | COPPER | COPPER | COPPER | COPPER |
| THICKNESS OF SOLDER LAYER | 18 μm ON ONE SIDE | 18 μm ON ONE SIDE | 18 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |
| COMPOSITION OF SOLDER LAYER | SnCu | SnCu | SnCu | SnCu | SnCu | SnCu | SnCu | SnCu | SnCu |
| THICKNESS OF Sn LAYER (μm) | 0 | 0.03 | 10 | 0 | 0.03 | 15 | 0 | 0.002 | 0.5 |

TABLE 4-continued

|  | COMPARATIVE EXAMPLE 10 | COMPARATIVE EXAMPLE 11 | COMPARATIVE EXAMPLE 12 | COMPARATIVE EXAMPLE 13 | COMPARATIVE EXAMPLE 14 | COMPARATIVE EXAMPLE 15 | COMPARATIVE EXAMPLE 16 | COMPARATIVE EXAMPLE 17 | COMPARATIVE EXAMPLE 18 |
|---|---|---|---|---|---|---|---|---|---|
| Sn LAYER:SOLDER LAYER | 0.000 0:100 | 0.167 LESS THAN LOWER LIMIT VALUE | 55.556 EXCEEDING UPPER LIMIT VALUE | 0.000 0:100 | 0.079 LESS THAN LOWER LIMIT VALUE | 39.474 EXCEEDING UPPER LIMIT VALUE | 0.000 0:100 | 0.200 LESS THAN LOWER LIMIT VALUE | 50.000 EXCEEDING UPPER LIMIT VALUE |
| YELLOWNESS | X | X | ○ | X | X | ○ | X | X | ○ |
| DEFECT AT THE TIME OF BONDING | ○ | ○ | X | ○ | ○ | X | ○ | ○ | X |

In the following Table 5, aspects in which copper is used as the material of the core and the solder layer composition is made of SnAg (Ag 3.5 Sn balance) are shown as Examples 19 to 27. Also in the following Table 6, aspects in which copper is used as the material of the core and the solder layer composition is made of SnAg are shown as Comparative Examples 19 to 27. In Examples 19 to 21 and Comparative Examples 19 to 21, the thickness of the solder layer one side is 18 μm, but the thicknesses of the Sn layer one side are different from each other. In Examples 22 to 24 and Comparative Examples 22 to 24, the thickness of the solder layer on one side is 38 μm, but the thicknesses of the Sn layer on one side are different from each other. In Examples 25 to 27 and Comparative Examples 25 to 27, the thickness of the solder layer on one side is 1 μm, but the thicknesses of the Sn layer on one side are different from each other. In all of Examples 19 to 27, good results could be confirmed to be obtained in each of yellowness and a defect at the time of bonding. Meanwhile, in all of Comparative Examples 19 to 27, any of yellowness and the time of bonding could be confirmed to be poor. In particular, it could be confirmed that when the Sn layer is not provided or when the thickness of the Sn layer is less than 0.215% of that of the solder layer, a problem in yellowness occurs. Meanwhile, it could be confirmed that when the thickness of the Sn layer exceeds 36% of that of the solder layer, a defect at the time of bonding occurs.

TABLE 5

|  | EXAMPLE 19 | EXAMPLE 20 | EXAMPLE 21 | EXAMPLE 22 | EXAMPLE 23 | EXAMPLE 24 | EXAMPLE 25 | EXAMPLE 26 | EXAMPLE 27 |
|---|---|---|---|---|---|---|---|---|---|
| CORE MATERIAL | COPPER | COPPER | COPPER | COPPER | COPPER | COPPER | COPPER | COPPER | COPPER |
| THICKNESS OF SOLDER LAYER | 18 μm ON ONE SIDE | 18 μm ON ONE SIDE | 18 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |
| COMPOSITION OF SOLDER LAYER | SnAg | SnAg | SnAg | SnAg | SnAg | SnAg | SnAg | SnAg | SnAg |
| THICKNESS OF Sn LAYER (μm) | 0.1 | 0.5 | 6 | 0.1 | 0.5 | 12 | 0.1 | 0.23 | 0.36 |
| Sn LAYER:SOLDER LAYER | 0.556 | 2.778 | 33.333 | 0.263 | 1.316 | 31.579 | 10.000 | 23.000 | 36.000 |
| YELLOWNESS | ○ | ○ | ○ | ○ | ○ | ○ | ○ | ○ | ○ |
| DEFECT AT THE TIME OF BONDING | ○ | ○ | ○ | ○ | ○ | ○ | ○ | ○ | ○ |

TABLE 6

|  | COMPARATIVE EXAMPLE 19 | COMPARATIVE EXAMPLE 20 | COMPARATIVE EXAMPLE 21 | COMPARATIVE EXAMPLE 22 | COMPARATIVE EXAMPLE 23 | COMPARATIVE EXAMPLE 24 | COMPARATIVE EXAMPLE 25 | COMPARATIVE EXAMPLE 26 | COMPARATIVE EXAMPLE 27 |
|---|---|---|---|---|---|---|---|---|---|
| CORE MATERIAL | COPPER | COPPER | COPPER | COPPER | COPPER | COPPER | COPPER | COPPER | COPPER |
| THICKNESS OF SOLDER LAYER | 18 μm ON ONE SIDE | 18 μm ON ONE SIDE | 18 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |
| COMPOSITION OF SOLDER LAYER | SnAg | SnAg | SnAg | SnAg | SnAg | SnAg | SnAg | SnAg | SnAg |
| THICKNESS OF Sn LAYER (μm) | 0 | 0.03 | 10 | 0 | 0.03 | 15 | 0 | 0.002 | 0.5 |
| Sn LAYER:SOLDER LAYER | 0.000 0:100 | 0.167 LESS THAN LOWER LIMIT VALUE | 55.556 EXCEEDING UPPER LIMIT VALUE | 0.000 0:100 | 0.079 LESS THAN LOWER LIMIT VALUE | 39.474 EXCEEDING UPPER LIMIT VALUE | 0.000 0:100 | 0.200 LESS THAN LOWER LIMIT VALUE | 50.000 EXCEEDING UPPER LIMIT VALUE |

TABLE 6-continued

| | COMPARATIVE EXAMPLE 19 | COMPARATIVE EXAMPLE 20 | COMPARATIVE EXAMPLE 21 | COMPARATIVE EXAMPLE 22 | COMPARATIVE EXAMPLE 23 | COMPARATIVE EXAMPLE 24 | COMPARATIVE EXAMPLE 25 | COMPARATIVE EXAMPLE 26 | COMPARATIVE EXAMPLE 27 |
|---|---|---|---|---|---|---|---|---|---|
| YELLOWNESS | X | X | ◯ | X | X | ◯ | X | X | ◯ |
| DEFECT AT THE TIME OF BONDING | ◯ | ◯ | X | ◯ | ◯ | X | ◯ | ◯ | X |

In the following Table 7, aspects in which copper is used as the material of the core and the solder layer composition is made of SnSb (Sb 10 Sn balance) are shown as Examples 28 to 36. Also in the following Table 8, aspects in which copper is used as the material of the core and the solder layer composition is made of SnSb are shown as Comparative Examples 28 to 36. In Examples 28 to 30 and Comparative Examples 28 to 30, the thickness of the solder layer on one side is 18 μm, but the thicknesses of the Sn layer on one side are different from each other. In Examples 31 to 33 and Comparative Examples 31 to 33, the thickness of the solder layer on one side is 38 μm, but the thicknesses of the Sn layer on one side are different from each other. In Examples 34 to 36 and Comparative Examples 34 to 36, the thickness of the solder layer on one side is 1 μm, but the thicknesses of the Sn layer on one side are different from each other. In all of Examples 28 to 36, good results could be confirmed to be obtained in each of yellowness and a defect at the time of bonding. Meanwhile, in all of Comparative Examples 28 to 36, any of yellowness and the time of bonding could be confirmed to be poor. In particular, it could be confirmed that when the Sn layer is not provided or when the thickness of the Sn layer is less than 0.215% of that of the solder layer, a problem in yellowness occurs. Meanwhile, it could be confirmed that when the thickness of the Sn layer exceeds 36% of that of the solder layer, a defect at the time of bonding occurs.

TABLE 7

| | EXAMPLE 28 | EXAMPLE 29 | EXAMPLE 30 | EXAMPLE 31 | EXAMPLE 32 | EXAMPLE 33 | EXAMPLE 34 | EXAMPLE 35 | EXAMPLE 36 |
|---|---|---|---|---|---|---|---|---|---|
| CORE MATERIAL | COPPER | COPPER | COPPER | COPPER | COPPER | COPPER | COPPER | COPPER | COPPER |
| THICKNESS OF SOLDER LAYER | 18 μm ON ONE SIDE | 18 μm ON ONE SIDE | 18 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |
| COMPOSITION OF SOLDER LAYER | SnSb | SnSb | SnSb | SnSb | SnSb | SnSb | SnSb | SnSb | SnSb |
| THICKNESS OF Sn LAYER (μm) | 0.1 | 0.5 | 6 | 0.1 | 0.5 | 12 | 0.1 | 0.23 | 0.36 |
| Sn LAYER:SOLDER LAYER | 0.556 | 2.778 | 33.333 | 0.263 | 1.316 | 31.579 | 10.000 | 23.000 | 36.000 |
| YELLOWNESS | ◯ | ◯ | ◯ | ◯ | ◯ | ◯ | ◯ | ◯ | ◯ |
| DEFECT AT THE TIME OF BONDING | ◯ | ◯ | ◯ | ◯ | ◯ | ◯ | ◯ | ◯ | ◯ |

TABLE 8

| | COMPARATIVE EXAMPLE 28 | COMPARATIVE EXAMPLE 29 | COMPARATIVE EXAMPLE 30 | COMPARATIVE EXAMPLE 31 | COMPARATIVE EXAMPLE 32 | COMPARATIVE EXAMPLE 33 | COMPARATIVE EXAMPLE 34 | COMPARATIVE EXAMPLE 35 | COMPARATIVE EXAMPLE 36 |
|---|---|---|---|---|---|---|---|---|---|
| CORE MATERIAL | COPPER | COPPER | COPPER | COPPER | COPPER | COPPER | COPPER | COPPER | COPPER |
| THICKNESS OF SOLDER LAYER | 18 μm ON ONE SIDE | 18 μm ON ONE SIDE | 18 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |
| COMPOSITION OF SOLDER LAYER | SnSb | SnSb | SnSb | SnSb | SnSb | SnSb | SnSb | SnSb | SnSb |
| THICKNESS OF Sn LAYER (μm) | 0 | 0.03 | 10 | 0 | 0.03 | 15 | 0 | 0.002 | 0.5 |
| Sn LAYER:SOLDER LAYER | 0.000 0:100 | 0.167 LESS THAN LOWER LIMIT VALUE | 55.556 EXCEEDING UPPER LIMIT VALUE | 0.000 0:100 | 0.079 LESS THAN LOWER LIMIT VALUE | 39.474 EXCEEDING UPPER LIMIT VALUE | 0.000 0:100 | 0.200 LESS THAN LOWER LIMIT VALUE | 50.000 EXCEEDING UPPER LIMIT VALUE |
| YELLOWNESS | X | X | ◯ | X | X | ◯ | X | X | ◯ |
| DEFECT AT THE TIME OF BONDING | ◯ | ◯ | X | ◯ | ◯ | X | ◯ | ◯ | X |

In the following Table 9, aspects in which copper is used as the material of the core and the solder layer composition is made of SnIn (In 45 Sn balance) is shown as Examples 37 to 45. Also in the following Table 10, aspects in which copper is used as the material of the core and the solder layer composition is made of SnIn are shown as Comparative Examples 37 to 45. In Examples 37 to 39 and Comparative Examples 37 to 39, the thickness of the solder layer on one side is 18 μm, but the thicknesses of the Sn layer on one side are different from each other. In Examples 40 to 42 and Comparative Examples 40 to 42, the thickness of the solder layer on one side is 38 μm, but the thicknesses of the Sn layer on one side are different from each other. In Examples 43 to 45 and Comparative Examples 43 to 45, the thickness of the solder layer on one side is 1 μm, but the thicknesses of the Sn layer on one side are different from each other. In all of Examples 37 to 45, good results could be confirmed to be obtained in each of yellowness and a defect at the time of bonding. Meanwhile, in all of Comparative Examples 37 to 45, any of yellowness and the time of bonding could be confirmed to be poor. In particular, it could be confirmed that when the Sn layer is not provided or when the thickness of the Sn layer is less than 0.215% of that of the solder layer, a problem in yellowness occurs. Meanwhile, it could be confirmed that when the thickness of the Sn layer exceeds 36% of that of the solder layer, a defect at the time of bonding occurs.

In the following Table 11, aspects in which copper is used as the material of the core and the solder layer composition is made of SnPb (Pb 37 Sn balance) are shown as Examples 46 to 54. Also in the following Table 12, aspects in which copper is used as the material of the core and the solder layer composition is made of SnPb are shown as Comparative Examples 46 to 54. In Examples 46 to 48 and Comparative Examples 46 to 48, the thickness of the solder layer on one side is 18 μm, but the thicknesses of the Sn layer on one side are different from each other. In Examples 49 to 51 and Comparative Examples 49 to 51, the thickness of the solder layer on one side is 38 μm, but the thicknesses of the Sn layer on one side are different from each other. In Examples 52 to 54 and Comparative Examples 52 to 54, the thickness of the solder layer on one side is 1 μm, but the thicknesses of the Sn layer on one side are different from each other. In all of Examples 46 to 54, good results could be confirmed to be obtained in each of yellowness and a defect at the time of bonding. Meanwhile, in all of Comparative Examples 46 to 54, any of yellowness and the time of bonding could be confirmed to be poor. In particular, it could be confirmed that when the Sn layer is not provided or when the thickness of the Sn layer is less than 0.215% of that of the solder layer, a problem in yellowness occurs. Meanwhile, it could be confirmed that when the thickness of the Sn layer exceeds 36% of that of the solder layer, a defect at the time of bonding occurs.

TABLE 9

| | EXAMPLE 37 | EXAMPLE 38 | EXAMPLE 39 | EXAMPLE 40 | EXAMPLE 41 | EXAMPLE 42 | EXAMPLE 43 | EXAMPLE 44 | EXAMPLE 45 |
|---|---|---|---|---|---|---|---|---|---|
| CORE MATERIAL | COPPER | COPPER | COPPER | COPPER | COPPER | COPPER | COPPER | COPPER | COPPER |
| THICKNESS OF SOLDER LAYER | 18 μm ON ONE SIDE | 18 μm ON ONE SIDE | 18 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |
| COMPOSITION OF SOLDER LAYER | SnIn | SnIn | SnIn | SnIn | SnIn | SnIn | SnIn | SnIn | SnIn |
| THICKNESS OF Sn LAYER (μm) | 0.1 | 0.5 | 6 | 0.1 | 0.5 | 12 | 0.1 | 0.23 | 0.36 |
| Sn LAYER:SOLDER LAYER | 0.556 | 2.778 | 33.333 | 0.263 | 1.316 | 31.579 | 10.000 | 23.000 | 36.000 |
| YELLOWNESS | ○ | ○ | ○ | ○ | ○ | ○ | ○ | ○ | ○ |
| DEFECT AT THE TIME OF BONDING | ○ | ○ | ○ | ○ | ○ | ○ | ○ | ○ | ○ |

TABLE 10

| | COMPARATIVE EXAMPLE 37 | COMPARATIVE EXAMPLE 38 | COMPARATIVE EXAMPLE 39 | COMPARATIVE EXAMPLE 40 | COMPARATIVE EXAMPLE 41 | COMPARATIVE EXAMPLE 42 | COMPARATIVE EXAMPLE 43 | COMPARATIVE EXAMPLE 44 | COMPARATIVE EXAMPLE 45 |
|---|---|---|---|---|---|---|---|---|---|
| CORE MATERIAL | COPPER | COPPER | COPPER | COPPER | COPPER | COPPER | COPPER | COPPER | COPPER |
| THICKNESS OF SOLDER LAYER | 18 μm ON ONE SIDE | 18 μm ON ONE SIDE | 18 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |
| COMPOSITION OF SOLDER LAYER | SnIn | SnIn | SnIn | SnIn | SnIn | SnIn | SnIn | SnIn | SnIn |
| THICKNESS OF Sn LAYER (μm) | 0 | 0.03 | 10 | 0 | 0.03 | 15 | 0 | 0.002 | 0.5 |
| Sn LAYER:SOLDER LAYER | 0.000 0:100 | 0.167 LESS THAN LOWER LIMIT VALUE | 55.556 EXCEEDING UPPER LIMIT VALUE | 0.000 0:100 | 0.079 LESS THAN LOWER LIMIT VALUE | 39.414 EXCEEDING UPPER LIMIT VALUE | 0.000 0:100 | 0.200 LESS THAN LOWER LIMIT VALUE | 50.000 EXCEEDING UPPER LIMIT VALUE |
| YELLOWNESS | X | X | ○ | X | X | ○ | X | X | ○ |
| DEFECT AT THE TIME OF BONDING | ○ | ○ | X | ○ | ○ | X | ○ | ○ | X |

TABLE 11

|  | EXAMPLE 46 | EXAMPLE 47 | EXAMPLE 48 | EXAMPLE 49 | EXAMPLE 50 | EXAMPLE 51 | EXAMPLE 52 | EXAMPLE 53 | EXAMPLE 54 |
|---|---|---|---|---|---|---|---|---|---|
| CORE MATERIAL | COPPER | COPPER | COPPER | COPPER | COPPER | COPPER | COPPER | COPPER | COPPER |
| THICKNESS OF SOLDER LAYER | 18 μm ON ONE SIDE | 18 μM ON ONE SIDE | 18 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |
| COMPOSITION OF SOLDER LAYER | SnPb | SnPb | SnPb | SnPb | SnPb | SnPb | SnPb | SnPb | SnPb |
| THICKNESS OF Sn LAYER (μm) | 0.1 | 0.5 | 6 | 0.1 | 0.5 | 12 | 0.1 | 0.23 | 0.36 |
| Sn LAYER:SOLDER LAYER | 0.556 | 2.778 | 33.333 | 0.263 | 1.316 | 31.579 | 10.000 | 23.000 | 36.000 |
| YELLOWNESS | ○ | ○ | ○ | ○ | ○ | ○ | ○ | ○ | ○ |
| DEFECT AT THE TIME OF BONDING | ○ | ○ | ○ | ○ | ○ | ○ | ○ | ○ | ○ |

TABLE 12

|  | COMPARATIVE EXAMPLE 46 | COMPARATIVE EXAMPLE 47 | COMPARATIVE EXAMPLE 48 | COMPARATIVE EXAMPLE 49 | COMPARATIVE EXAMPLE 50 | COMPARATIVE EXAMPLE 51 | COMPARATIVE EXAMPLE 52 | COMPARATIVE EXAMPLE 53 | COMPARATIVE EXAMPLE 54 |
|---|---|---|---|---|---|---|---|---|---|
| CORE MATERIAL | COPPER | COPPER | COPPER | COPPER | COPPER | COPPER | COPPER | COPPER | COPPER |
| THICKNESS OF SOLDER LAYER | 18 μm ON ONE SIDE | 18 μm ON ONE SIDE | 18 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |
| COMPOSITION OF SOLDER LAYER | SnPb | SnPb | SnPb | SnPb | SnPb | SnPb | SnPb | SnPb | SnPb |
| THICKNESS OF Sn LAYER (μm) | 0 | 0.03 | 10 | 0 | 0.03 | 15 | 0 | 0.002 | 0.5 |
| Sn LAYER:SOLDER LAYER | 0.000 0:100 | 0.167 LESS THAN LOWER LIMIT VALUE | 55.556 EXCEEDING UPPER LIMIT VALUE | 0.000 0:100 | 0.079 LESS THAN LOWER LIMIT VALUE | 39.474 EXCEEDING UPPER LIMIT VALUE | 0.000 0:100 | 0.200 LESS THAN LOWER LIMIT VALUE | 50.000 EXCEEDING UPPER LIMIT VALUE |
| YELLOWNESS | X | X | ○ | X | X | ○ | X | X | ○ |
| DEFECT AT THE TIME OF BONDING | ○ | ○ | X | ○ | ○ | X | ○ | ○ | X |

In the following Tables 13 to 24, the solder layer composition was changed to SAC 305, SnCu (Cu 0.7 Sn balance), SnAg (Ag 3.5 Sn balance), SnSb (Sb 10 Sn balance), SnIn (In 45 Sn balance), and SnPb (Pb 37 Sn balance), and the thickness of the solder layer on one side and the thickness of the Sn layer on one side were changed in the same manner as in Examples 1 to 54 and Comparative Examples 1 to 54 shown in Tables 1 to 12 except that aluminum was used as the material of the core. In all of Examples 55 to 108, good results could be confirmed to be obtained in each of yellowness and a defect at the time of bonding. Meanwhile, in all of Comparative Examples 55 to 108, any of yellowness and the time of bonding could be confirmed to be poor. In particular, it could be confirmed that when the Sn layer is not provided or when the thickness of the Sn layer is less than 0.215% of that of the solder layer, a problem in yellowness occurs. Meanwhile, it could be confirmed that when the thickness of the Sn layer exceeds 36% of that of the solder layer, a defect at the time of bonding occurs.

TABLE 13

|  | EXAMPLE 55 | EXAMPLE 56 | EXAMPLE 57 | EXAMPLE 58 | EXAMPLE 59 | EXAMPLE 60 | EXAMPLE 61 | EXAMPLE 62 | EXAMPLE 63 |
|---|---|---|---|---|---|---|---|---|---|
| CORE MATERIAL | ALUMINUM | ALUMINUM | ALUMINUM | ALUMINUM | ALUMINUM | ALUMINUM | ALUMINUM | ALUMINUM | ALUMINUM |
| THICKNESS OF SOLDER LAYER | 18 μm ON ONE SIDE | 18 μm ON ONE SIDE | 18 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |
| COMPOSITION OF SOLDER LAYER | SAC305 | SAC305 | SAC305 | SAC305 | SAC305 | SAC305 | SAC305 | SAC305 | SAC305 |
| THICKNESS OF Sn LAYER (μm) | 0.1 | 0.5 | 6 | 0.1 | 0.5 | 12 | 0.1 | 0.23 | 0.36 |
| Sn LAYER:SOLDER LAYER | 0.556 | 2.778 | 33.333 | 0.263 | 1.316 | 31.579 | 10.000 | 23.000 | 36.000 |

TABLE 13-continued

|  | EXAMPLE 55 | EXAMPLE 56 | EXAMPLE 57 | EXAMPLE 58 | EXAMPLE 59 | EXAMPLE 60 | EXAMPLE 61 | EXAMPLE 62 | EXAMPLE 63 |
|---|---|---|---|---|---|---|---|---|---|
| YELLOWNESS | ○ | ○ | ○ | ○ | ○ | ○ | ○ | ○ | ○ |
| DEFECT AT THE TIME OF BONDING | ○ | ○ | ○ | ○ | ○ | ○ | ○ | ○ | ○ |

TABLE 14

|  | COMPARATIVE EXAMPLE 55 | COMPARATIVE EXAMPLE 56 | COMPARATIVE EXAMPLE 57 | COMPARATIVE EXAMPLE 58 | COMPARATIVE EXAMPLE 59 | COMPARATIVE EXAMPLE 60 | COMPARATIVE EXAMPLE 61 | COMPARATIVE EXAMPLE 62 | COMPARATIVE EXAMPLE 63 |
|---|---|---|---|---|---|---|---|---|---|
| CORE MATERIAL | ALUMINUM | ALUMINUM | ALUMINUM | ALUMINUM | ALUMINUM | ALUMINUM | ALUMINUM | ALUMINUM | ALUMINUM |
| THICKNESS OF SOLDER LAYER | 18 μm ON ONE SIDE | 18 μm ON ONE SIDE | 18 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |
| COMPOSITION OF SOLDER LAYER | SAC305 | SAC305 | SAC305 | SAC305 | SAC305 | SAC305 | SAC305 | SAC305 | SAC305 |
| THICKNESS OF Sn LAYER (μm) | 0 | 0.03 | 10 | 0 | 0.03 | 15 | 0 | 0.002 | 0.5 |
| Sn LAYER:SOLDER LAYER | 0.000 0:100 | 0.167 LESS THAN LOWER LIMIT VALUE | 55.556 EXCEEDING UPPER LIMIT VALUE | 0.000 0:100 | 0.079 LESS THAN LOWER LIMIT VALUE | 39.474 EXCEEDING UPPER LIMIT VALUE | 0.000 0:100 | 0.200 LESS THAN LOWER LIMIT VALUE | 50.000 EXCEEDING UPPER LIMIT VALUE |
| YELLOWNESS | X | X | ○ | X | X | ○ | X | X | ○ |
| DEFECT AT THE TIME OF BONDING | ○ | ○ | X | ○ | ○ | X | ○ | ○ | X |

TABLE 15

|  | EXAMPLE 64 | EXAMPLE 65 | EXAMPLE 66 | EXAMPLE 67 | EXAMPLE 68 | EXAMPLE 69 | EXAMPLE 70 | EXAMPLE 71 | EXAMPLE 72 |
|---|---|---|---|---|---|---|---|---|---|
| CORE MATERIAL | ALUMINUM | ALUMINUM | ALUMINUM | ALUMINUM | ALUMINUM | ALUMINUM | ALUMINUM | ALUMINUM | ALUMINUM |
| THICKNESS OF SOLDER LAYER | 18 μm ON ONE SIDE | 18 μm ON ONE SIDE | 18 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |
| COMPOSITION OF SOLDER LAYER | SnCu | SnCu | SnCu | SnCu | SnCu | SnCu | SnCu | SnCu | SnCu |
| THICKNESS OF Sn LAYER (μm) | 0.1 | 0.5 | 6 | 0.1 | 0.5 | 12 | 0.1 | 0.23 | 0.36 |
| Sn LAYER:SOLDER LAYER | 0.556 | 2.778 | 33.333 | 0.263 | 1.316 | 31.579 | 10.000 | 23.000 | 36.000 |
| YELLOWNESS | ○ | ○ | ○ | ○ | ○ | ○ | ○ | ○ | ○ |
| DEFECT AT THE TIME OF BONDING | ○ | ○ | ○ | ○ | ○ | ○ | ○ | ○ | ○ |

TABLE 16

|  | COMPARATIVE EXAMPLE 64 | COMPARATIVE EXAMPLE 65 | COMPARATIVE EXAMPLE 66 | COMPARATIVE EXAMPLE 67 | COMPARATIVE EXAMPLE 68 | COMPARATIVE EXAMPLE 69 | COMPARATIVE EXAMPLE 70 | COMPARATIVE EXAMPLE 71 | COMPARATIVE EXAMPLE 72 |
|---|---|---|---|---|---|---|---|---|---|
| CORE MATERIAL | ALUMINUM | ALUMINUM | ALUMINUM | ALUMINUM | ALUMINUM | ALUMINUM | ALUMINUM | ALUMINUM | ALUMINUM |
| THICKNESS OF SOLDER LAYER | 18 μm ON ONE SIDE | 18 μm ON ONE SIDE | 18 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |

TABLE 16-continued

| | COMPARATIVE EXAMPLE 64 | COMPARATIVE EXAMPLE 65 | COMPARATIVE EXAMPLE 66 | COMPARATIVE EXAMPLE 67 | COMPARATIVE EXAMPLE 68 | COMPARATIVE EXAMPLE 69 | COMPARATIVE EXAMPLE 70 | COMPARATIVE EXAMPLE 71 | COMPARATIVE EXAMPLE 72 |
|---|---|---|---|---|---|---|---|---|---|
| COMPOSITION OF SOLDER LAYER | SnCu | SnCu | SnCu | SnCu | SnCu | SnCu | SnCu | SnCu | SnCu |
| THICKNESS OF Sn LAYER (μm) | 0 | 0.03 | 10 | 0 | 0.03 | 15 | 0 | 0.002 | 0.5 |
| Sn LAYER:SOLDER LAYER | 0.000 0:100 | 0.167 LESS THAN LOWER LIMIT VALUE | 55.556 EXCEEDING UPPER LIMIT VALUE | 0.000 0:100 | 0.079 LESS THAN LOWER LIMIT VALUE | 39.474 EXCEEDING UPPER LIMIT VALUE | 0.000 0:100 | 0.200 LESS THAN LOWER LIMIT VALUE | 50.000 EXCEEDING UPPER LIMIT VALUE |
| YELLOWNESS | X | X | ○ | X | X | ○ | X | X | ○ |
| DEFECT AT THE TIME OF BONDING | ○ | ○ | X | ○ | ○ | X | ○ | ○ | X |

TABLE 17

| | EXAMPLE 73 | EXAMPLE 74 | EXAMPLE 75 | EXAMPLE 76 | EXAMPLE 77 | EXAMPLE 78 | EXAMPLE 79 | EXAMPLE 80 | EXAMPLE 81 |
|---|---|---|---|---|---|---|---|---|---|
| CORE MATERIAL | ALUMINUM | ALUMINUM | ALUMINUM | ALUMINUM | ALUMINUM | ALUMINUM | ALUMINUM | ALUMINUM | ALUMINUM |
| THICKNESS OF SOWER LAYER | 18 μm ON ONE SIDE | 18 μm ON ONE SIDE | 18 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |
| COMPOSITION OF SOLDER LAYER | SnAg | SnAg | SnAg | SnAg | SnAg | SnAg | SnAg | SnAg | SnAg |
| THICKNESS OF Sn LAYER (μm) | 0.1 | 0.5 | 6 | 0.1 | 0.5 | 12 | 0.1 | 0.23 | 0.36 |
| Sn LAYER:SOLDER LAYER | 0.556 | 2.778 | 33.333 | 0.263 | 1.316 | 31.579 | 10.000 | 23.000 | 36.000 |
| YELLOWNESS | ○ | ○ | ○ | ○ | ○ | ○ | ○ | ○ | ○ |
| DEFECT AT THE TIME OF BONDING | ○ | ○ | ○ | ○ | ○ | ○ | ○ | ○ | ○ |

TABLE 18

| | COMPARATIVE EXAMPLE 73 | COMPARATIVE EXAMPLE 74 | COMPARATIVE EXAMPLE 75 | COMPARATIVE EXAMPLE 76 | COMPARATIVE EXAMPLE 77 | COMPARATIVE EXAMPLE 78 | COMPARATIVE EXAMPLE 79 | COMPARATIVE EXAMPLE 80 | COMPARATIVE EXAMPLE 81 |
|---|---|---|---|---|---|---|---|---|---|
| CORE MATERIAL | ALUMINUM | ALUMINUM | ALUMINUM | ALUMINUM | ALUMINUM | ALUMINUM | ALUMINUM | ALUMINUM | ALUMINUM |
| THICKNESS OF SOLDER LAYER | 18 μm ON ONE SIDE | 18 μm ON ONE SIDE | 18 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |
| COMPOSITION OF SOLDER LAYER | SnAg | SnAg | SnAg | SnAg | SnAg | SnAg | SnAg | SnAg | SnAg |
| THICKNESS OF Sn LAYER (μm) | 0 | 0.03 | 10 | 0 | 0.03 | 15 | 0 | 0.002 | 0.5 |
| Sn LAYER:SOLDER LAYER | 0.000 0:100 | 0.167 LESS THAN LOWER LIMIT VALUE | 55.556 EXCEEDING UPPER LIMIT VALUE | 0.000 0:100 | 0.079 LESS THAN LOWER LIMIT VALUE | 39.474 EXCEEDING UPPER LIMIT VALUE | 0.000 0:100 | 0.200 LESS THAN LOWER LIMIT VALUE | 50.000 EXCEEDING UPPER LIMIT VALUE |
| YELLOWNESS | X | X | ○ | X | X | ○ | X | X | ○ |
| DEFECT AT THE TIME OF BONDING | ○ | ○ | X | ○ | ○ | X | ○ | ○ | X |

TABLE 19

| | EXAMPLE 82 | EXAMPLE 83 | EXAMPLE 84 | EXAMPLE 85 | EXAMPLE 86 | EXAMPLE 87 | EXAMPLE 88 | EXAMPLE 89 | EXAMPLE 90 |
|---|---|---|---|---|---|---|---|---|---|
| CORE MATERIAL | ALUMINUM | ALUMINUM | ALUMINUM | ALUMINUM | ALUMINUM | ALUMINUM | ALUMINUM | ALUMINUM | ALUMINUM |
| THICKNESS OF SOLDER LAYER | 18 μm ON ONE SIDE | 18 μm ON ONE SIDE | 18 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |
| COMPOSITION OF SOLDER LAYER | SnSb | SnSb | SnSb | SnSb | SnSb | SnSb | SnSb | SnSb | SnSb |
| THICKNESS OF Sn LAYER (μm) | 0.1 | 0.5 | 6 | 0.1 | 0.5 | 12 | 0.1 | 0.23 | 0.36 |
| Sn LAYER:SOLDER LAYER | 0.556 | 2.778 | 33.333 | 0.263 | 1.316 | 31.579 | 10.000 | 23.000 | 36.000 |
| YELLOWNESS | ○ | ○ | ○ | ○ | ○ | ○ | ○ | ○ | ○ |
| DEFECT AT THE TIME OF BONDING | ○ | ○ | ○ | ○ | ○ | ○ | ○ | ○ | ○ |

TABLE 20

| | COMPARATIVE EXAMPLE 82 | COMPARATIVE EXAMPLE 83 | COMPARATIVE EXAMPLE 84 | COMPARATIVE EXAMPLE 85 | COMPARATIVE EXAMPLE 86 | COMPARATIVE EXAMPLE 87 | COMPARATIVE EXAMPLE 88 | COMPARATIVE EXAMPLE 89 | COMPARATIVE EXAMPLE 90 |
|---|---|---|---|---|---|---|---|---|---|
| CORE MATERIAL | ALUMINUM | ALUMINUM | ALUMINUM | ALUMINUM | ALUMINUM | ALUMINUM | ALUMINUM | ALUMINUM | ALUMINUM |
| THICKNESS OF SOLDER LAYER | 18 μm ON ONE SIDE | 18 μm ON ONE SIDE | 18 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |
| COMPOSITION OF SOLDER LAYER | SnSb | SnSb | SnSb | SnSb | SnSb | SnSb | SnSb | SnSb | SnSb |
| THICKNESS OF Sn LAYER (μm) | 0 | 0.03 | 10 | 0 | 0.03 | 15 | 0 | 0.002 | 0.5 |
| Sn LAYER:SOLDER LAYER | 0.000 0:100 | 0.167 LESS THAN LOWER LIMIT VALUE | 55.556 EXCEEDING UPPER LIMIT VALUE | 0.000 0:100 | 0.079 LESS THAN LOWER LIMIT VALUE | 39.474 EXCEEDING UPPER LIMIT VALUE | 0.000 0:100 | 0.200 LESS THAN LOWER LIMIT VALUE | 50.000 EXCEEDING UPPER LIMIT VALUE |
| YELLOWNESS | X | X | ○ | X | X | ○ | X | X | ○ |
| DEFECT AT THE TIME OF BONDING | ○ | ○ | X | ○ | ○ | X | ○ | ○ | X |

TABLE 21

| | EXAMPLE 91 | EXAMPLE 92 | EXAMPLE 93 | EXAMPLE 94 | EXAMPLE 95 | EXAMPLE 96 | EXAMPLE 97 | EXAMPLE 98 | EXAMPLE 99 |
|---|---|---|---|---|---|---|---|---|---|
| CORE MATERIAL | ALUMINUM | ALUMINUM | ALUMINUM | ALUMINUM | ALUMINUM | ALUMINUM | ALUMINUM | ALUMINUM | ALUMINUM |
| THICKNESS OF SOLDER LAYER | 18 μm ON ONE SIDE | 18 μm ON ONE SIDE | 18 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |
| COMPOSITION OF SOLDER LAYER | SnIn | SnIn | SnIn | SnIn | SnIn | SnIn | SnIn | SnIn | SnIn |
| THICKNESS OF Sn LAYER (μm) | 0.1 | 0.5 | 6 | 0.1 | 0.5 | 12 | 0.1 | 0.23 | 0.36 |
| Sn LAYER:SOLDER LAYER | 0.556 | 2.778 | 33.333 | 0.263 | 1.316 | 31.579 | 10.000 | 23.000 | 36.000 |
| YELLOWNESS | ○ | ○ | ○ | ○ | ○ | ○ | ○ | ○ | ○ |
| DEFECT AT THE TIME OF BONDING | ○ | ○ | ○ | ○ | ○ | ○ | ○ | ○ | ○ |

TABLE 22

|  | COMPARATIVE EXAMPLE 91 | COMPARATIVE EXAMPLE 92 | COMPARATIVE EXAMPLE 93 | COMPARATIVE EXAMPLE 94 | COMPARATIVE EXAMPLE 95 | COMPARATIVE EXAMPLE 96 | COMPARATIVE EXAMPLE 97 | COMPARATIVE EXAMPLE 98 | COMPARATIVE EXAMPLE 99 |
|---|---|---|---|---|---|---|---|---|---|
| CORE MATERIAL | ALUMINUM | ALUMINUM | ALUMINUM | ALUMINUM | ALUMINUM | ALUMINUM | ALUMINUM | ALUMINUM | ALUMINUM |
| THICKNESS OF SOLDER LAYER | 18 μm ON ONE SIDE | 18 μm ON ONE SIDE | 18 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |
| COMPOSITION OF SOLDER LAYER | SnIn | SnIn | SnIn | SnIn | SnIn | SnIn | SnIn | SnIn | SnIn |
| THICKNESS OF Sn LAYER (μm) | 0 | 0.03 | 10 | 0 | 0.03 | 15 | 0 | 0.002 | 0.5 |
| Sn LAYER:SOLDER LAYER | 0.000 0:100 | 0.167 LESS THAN LOWER LIMIT VALUE | 55.556 EXCEEDING UPPER LIMIT VALUE | 0.000 0:100 | 0.079 LESS THAN LOWER LIMIT VALUE | 39.474 EXCEEDING UPPER LIMIT VALUE | 0.000 0:100 | 0.200 LESS THAN LOWER LIMIT VALUE | 50.000 EXCEEDING UPPER LIMIT VALUE |
| YELLOWNESS | X | X | ○ | X | X | ○ | X | X | ○ |
| DEFECT AT THE TIME OF BONDING | ○ | ○ | X | ○ | ○ | X | ○ | ○ | X |

TABLE 23

|  | EXAMPLE 100 | EXAMPLE 101 | EXAMPLE 102 | EXAMPLE 103 | EXAMPLE 104 | EXAMPLE 105 | EXAMPLE 106 | EXAMPLE 107 | EXAMPLE 108 |
|---|---|---|---|---|---|---|---|---|---|
| CORE MATERIAL | ALUMINUM | ALUMINUM | ALUMINUM | ALUMINUM | ALUMINUM | ALUMINUM | ALUMINUM | ALUMINUM | ALUMINUM |
| THICKNESS OF SOLDER LAYER | 18 μm ON ONE SIDE | 18 μm ON ONE SIDE | 18 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |
| COMPOSITION OF SOLDER LAYER | SnPb | SnPb | SnPb | SnPb | SnPb | SnPb | SnPb | SnPb | SnPb |
| THICKNESS OF Sn LAYER (μm) | 0.1 | 0.5 | 6 | 0.1 | 0.5 | 12 | 0.1 | 0.23 | 0.36 |
| Sn LAYER:SOLDER LAYER | 0.556 | 2.778 | 33.333 | 0.263 | 1.316 | 31.579 | 10.000 | 23.000 | 36.000 |
| YELLOWNESS | ○ | ○ | ○ | ○ | ○ | ○ | ○ | ○ | ○ |
| DEFECT AT THE TIME OF BONDING | ○ | ○ | ○ | ○ | ○ | ○ | ○ | ○ | ○ |

TABLE 24

|  | COMPARATIVE EXAMPLE 100 | COMPARATIVE EXAMPLE 101 | COMPARATIVE EXAMPLE 102 | COMPARATIVE EXAMPLE 103 | COMPARATIVE EXAMPLE 104 | COMPARATIVE EXAMPLE 105 | COMPARATIVE EXAMPLE 106 | COMPARATIVE EXAMPLE 107 | COMPARATIVE EXAMPLE 108 |
|---|---|---|---|---|---|---|---|---|---|
| CORE MATERIAL | ALUMINUM | ALUMINUM | ALUMINUM | ALUMINUM | ALUMINUM | ALUMINUM | ALUMINUM | ALUMINUM | ALUMINUM |
| THICKNESS OF SOLDER LAYER | 18 μm ON ONE SIDE | 18 μm ON ONE SIDE | 18 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |
| COMPOSITION OF SOLDER LAYER | SnPb | SnPb | SnPb | SnPb | SnPb | SnPb | SnPb | SnPb | SnPb |
| THICKNESS OF Sn LAYER (μm) | 0 | 0.03 | 10 | 0 | 0.03 | 15 | 0 | 0.002 | 0.5 |
| Sn LAYER:SOLDER LAYER | 0.000 0:100 | 0.167 LESS THAN LOWER LIMIT VALUE | 55.556 EXCEEDING UPPER LIMIT VALUE | 0.000 0:100 | 0.079 LESS THAN LOWER LIMIT VALUE | 39.474 EXCEEDING UPPER LIMIT VALUE | 0.000 0:100 | 0.200 LESS THAN LOWER LIMIT VALUE | 50.000 EXCEEDING UPPER LIMIT VALUE |
| YELLOWNESS | X | X | ○ | X | X | ○ | X | X | ○ |
| DEFECT AT THE TIME OF BONDING | ○ | ○ | X | ○ | ○ | X | ○ | ○ | X |

In the following Tables 25 to 36, the solder layer composition was changed to SAC 305, SnCu (Cu 0.75 Sn balance), SnAg (Ag 3.5 Sn balance), SnSb (Sb 10 Sn balance), SnIn (In 45 Sn balance), and SnPb (Pb 37 Sn balance), and the thickness of the solder layer on one side and the thickness of the Sn layer on one side were changed in the same manner as in Examples 1 to 54 and Comparative Examples 1 to 54 shown in Tables 1 to 12, and Examples 55 to 108 and Comparative Examples 55 to 108 shown in Tables 13 to 24 except that a styrene-butadiene block copolymer as a resin was used as the material of the core. In all of Examples 109 to 162, good results could be confirmed to be obtained in each of yellowness and a defect at the time of bonding. Meanwhile, in all of Comparative Examples 109 to 162, any of yellowness and the time of bonding could be confirmed to be poor. In particular, it could be confirmed that when the Sn layer is not provided or when the thickness of the Sn layer is less than 0.215% of that of the solder layer, a problem in yellowness occurs. Meanwhile, it could be confirmed that when the thickness of the Sn layer exceeds 36% of that of the solder layer, a defect at the time of bonding occurs.

TABLE 25

|  | EXAMPLE 109 | EXAMPLE 110 | EXAMPLE 111 | EXAMPLE 112 | EXAMPLE 113 | EXAMPLE 114 | EXAMPLE 115 | EXAMPLE 116 | EXAMPLE 117 |
|---|---|---|---|---|---|---|---|---|---|
| COKE MATERIAL | RESIN | RESIN | RESIN | RESIN | RESIN | RESIN | RESIN | RESIN | RESIN |
| THICKNESS OF SOLDER LAYER | 18 μm ON ONE SIDE | 18 μm ON ONE SIDE | 18 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |
| COMPOSITION OF SOLDER LAYER | SAC305 | SAC305 | SAC305 | SAC305 | SAC305 | SAC305 | SAC305 | SAC305 | SAC305 |
| THICKNESS OF Sn LAYER (μm) | 0.1 | 0.5 | 6 | 0.1 | 0.5 | 12 | 0.1 | 0.23 | 0.36 |
| Sn LAYER:SOLDER LAYER | 0.556 | 2.778 | 33.333 | 0.263 | 1.316 | 31.579 | 10.000 | 23.000 | 36.000 |
| YELLOWNESS | ○ | ○ | ○ | ○ | ○ | ○ | ○ | ○ | ○ |
| DEFECT AT THE TIME OF BONDING | ○ | ○ | ○ | ○ | ○ | ○ | ○ | ○ | ○ |

TABLE 26

|  | COMPARATIVE EXAMPLE 109 | COMPARATIVE EXAMPLE 110 | COMPARATIVE EXAMPLE 111 | COMPARATIVE EXAMPLE 112 | COMPARATIVE EXAMPLE 113 | COMPARATIVE EXAMPLE 114 | COMPARATIVE EXAMPLE 115 | COMPARATIVE EXAMPLE 116 | COMPARATIVE EXAMPLE 117 |
|---|---|---|---|---|---|---|---|---|---|
| CORE MATERIAL | RESIN | RESIN | RESIN | RESIN | RESIN | RESIN | RESIN | RESIN | RESIN |
| THICKNESS OF SOLDER LAYER | 18 μm ON ONE SIDE | 18 μm ON ONE SIDE | 18 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |
| COMPOSITION OF SOLDER LAYER | SAC305 | SAC305 | SAC305 | SAC305 | SAC305 | SAC305 | SAC305 | SAC305 | SAC305 |
| THICKNESS OF Sn LAYER (μm) | 0 | 0.03 | 10 | 0 | 0.03 | 15 | 0 | 0.002 | 0.5 |
| Sn LAYER:SOLDER LAYER | 0.000 0:100 | 0.167 LESS THAN LOWER LIMIT VALUE | 55.556 EXCEEDING UPPER LIMIT VALUE | 0.000 0:100 | 0.079 LESS THAN LOWER LIMIT VALUE | 39.474 EXCEEDING UPPER LIMIT VALUE | 0.000 0:100 | 0.200 LESS THAN LOWER LIMIT VALUE | 50.000 EXCEEDING UPPER LIMIT VALUE |
| YELLOWNESS | X | X | ○ | X | X | ○ | X | X | ○ |
| DEFECT AT THE TIME OF BONDING | ○ | ○ | X | ○ | ○ | X | ○ | ○ | X |

TABLE 27

|  | EXAMPLE 118 | EXAMPLE 119 | EXAMPLE 120 | EXAMPLE 121 | EXAMPLE 122 | EXAMPLE 123 | EXAMPLE 124 | EXAMPLE 125 | EXAMPLE 126 |
|---|---|---|---|---|---|---|---|---|---|
| CORE MATERIAL | RESIN | RESIN | RESIN | RESIN | RESIN | RESIN | RESIN | RESIN | RESIN |
| THICKNESS OF SOLDER LAYER | 18 μm ON ONE SIDE | 18 μm ON ONE SIDE | 18 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |
| COMPOSITION OF SOLDER LAYER | SnCu | SnCu | SnCu | SnCu | SnCu | SnCu | SnCu | SnCu | SnCu |
| THICKNESS OF Sn LAYER (μm) | 0.1 | 0.5 | 6 | 0.1 | 0.5 | 12 | 0.1 | 0.23 | 0.36 |

TABLE 27-continued

|  | EXAMPLE 118 | EXAMPLE 119 | EXAMPLE 120 | EXAMPLE 121 | EXAMPLE 122 | EXAMPLE 123 | EXAMPLE 124 | EXAMPLE 125 | EXAMPLE 126 |
|---|---|---|---|---|---|---|---|---|---|
| Sn LAYER:SOLDER LAYER | 0.556 | 2.778 | 33.333 | 0.263 | 1.316 | 31.579 | 10.000 | 23.000 | 36.000 |
| YELLOWNESS | ◯ | ◯ | ◯ | ◯ | ◯ | ◯ | ◯ | ◯ | ◯ |
| DEFECT AT THE TIME OF BONDING | ◯ | ◯ | ◯ | ◯ | ◯ | ◯ | ◯ | ◯ | ◯ |

TABLE 28

|  | COMPARATIVE EXAMPLE 118 | COMPARATIVE EXAMPLE 119 | COMPARATIVE EXAMPLE 120 | COMPARATIVE EXAMPLE 121 | COMPARATIVE EXAMPLE 122 | COMPARATIVE EXAMPLE 123 | COMPARATIVE EXAMPLE 124 | COMPARATIVE EXAMPLE 125 | COMPARATIVE EXAMPLE 126 |
|---|---|---|---|---|---|---|---|---|---|
| CORE MATERIAL | RESIN | RESIN | RESIN | RESIN | RESIN | RESIN | RESIN | RESIN | RESIN |
| THICKNESS OF SOLDER LAYER | 18 μm ON ONE SIDE | 18 μm ON ONE SIDE | 18 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |
| COMPOSITION OF SOLDER LAYER | SnCu | SnCu | SnCu | SnCu | SnCu | SnCu | SnCu | SnCu | SnCu |
| THICKNESS OF Sn LAYER (μm) | 0 | 0.03 | 10 | 0 | 0.03 | 15 | 0 | 0.002 | 0.5 |
| Sn LAYER:SOLDER LAYER | 0.000 0:100 | 0.167 LESS THAN LOWER LIMIT VALUE | 55.556 EXCEEDING UPPER LIMIT VALUE | 0.000 0:100 | 0.079 LESS THAN LOWER LIMIT VALUE | 39.974 EXCEEDING UPPER LIMIT VALUE | 0.000 0:100 | 0.200 LESS THAN LOWER LIMIT VALUE | 50.000 EXCEEDING UPPER LIMIT VALUE |
| YELLOWNESS | X | X | ◯ | X | X | ◯ | X | X | ◯ |
| DEFECT AT THE TIME OF BONDING | ◯ | ◯ | X | ◯ | ◯ | X | ◯ | ◯ | X |

TABLE 29

|  | EXAMPLE 127 | EXAMPLE 128 | EXAMPLE 129 | EXAMPLE 130 | EXAMPLE 131 | EXAMPLE 132 | EXAMPLE 133 | EXAMPLE 134 | EXAMPLE 135 |
|---|---|---|---|---|---|---|---|---|---|
| CORE MATERIAL | RESIN | RESIN | RESIN | RESIN | RESIN | RESIN | RESIN | RESIN | RESIN |
| THICKNESS OF SOLDER LAYER | 18 μm ON ONE SIDE | 18 μm ON ONE SIDE | 18 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |
| COMPOSITION OF SOLDER LAYER | SnAg | SnAg | SnAg | SnAg | SnAg | SnAg | SnAg | SnAg | SnAg |
| THICKNESS OF Sn LAYER (μm) | 0.1 | 0.5 | 6 | 0.1 | 0.5 | 12 | 0.1 | 0.23 | 0.36 |
| Sn LAYER:SOLDER LAYER | 0.556 | 2.778 | 33.333 | 0.263 | 1.316 | 31.579 | 10.000 | 23.000 | 36.000 |
| YELLOWNESS | ◯ | ◯ | ◯ | ◯ | ◯ | ◯ | ◯ | ◯ | ◯ |
| DEFECT AT THE TIME OF BONDING | ◯ | ◯ | ◯ | ◯ | ◯ | ◯ | ◯ | ◯ | ◯ |

TABLE 30

|  | COMPARATIVE EXAMPLE 127 | COMPARATIVE EXAMPLE 128 | COMPARATIVE EXAMPLE 129 | COMPARATIVE EXAMPLE 130 | COMPARATIVE EXAMPLE 131 | COMPARATIVE EXAMPLE 132 | COMPARATIVE EXAMPLE 133 | COMPARATIVE EXAMPLE 134 | COMPARATIVE EXAMPLE 135 |
|---|---|---|---|---|---|---|---|---|---|
| CORE MATERIAL | RESIN | RESIN | RESIN | RESIN | RESIN | RESIN | RESIN | RESIN | RESIN |
| THICKNESS OF SOLDER LAYER | 18 μm ON ONE SIDE | 18 μm ON ONE SIDE | 18 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |

TABLE 30-continued

|  | COMPARATIVE EXAMPLE 127 | COMPARATIVE EXAMPLE 128 | COMPARATIVE EXAMPLE 129 | COMPARATIVE EXAMPLE 130 | COMPARATIVE EXAMPLE 131 | COMPARATIVE EXAMPLE 132 | COMPARATIVE EXAMPLE 133 | COMPARATIVE EXAMPLE 134 | COMPARATIVE EXAMPLE 135 |
|---|---|---|---|---|---|---|---|---|---|
| COMPOSITION OF SOLDER LAYER | SnAg | SnAg | SnAg | SnAg | SnAg | SnAg | SnAg | SnAg | SnAg |
| THICKNESS OF Sn LAYER (μm) | 0 | 0.03 | 10 | 0 | 0.03 | 15 | 0 | 0.002 | 0.5 |
| Sn LAYER:SOLDER LAYER | 0.000 0:100 | 0.167 LESS THAN LOWER LIMIT VALUE | 55.556 EXCEEDING UPPER LIMIT VALUE | 0.000 0:100 | 0.079 LESS THAN LOWER LIMIT VALUE | 39.474 EXCEEDING UPPER LIMIT VALUE | 0.000 0:100 | 0.200 LESS THAN LOWER LIMIT VALUE | 50.000 EXCEEDING UPPER LIMIT VALUE |
| YELLOWNESS | X | X | ○ | X | X | ○ | X | X | ○ |
| DEFECT AT THE TIME OF BONDING | ○ | ○ | X | ○ | ○ | X | ○ | ○ | X |

TABLE 31

|  | EXAMPLE 136 | EXAMPLE 137 | EXAMPLE 138 | EXAMPLE 139 | EXAMPLE 140 | EXAMPLE 141 | EXAMPLE 142 | EXAMPLE 143 | EXAMPLE 144 |
|---|---|---|---|---|---|---|---|---|---|
| CORE MATERIAL | RESIN | RESIN | RESIN | RESIN | RESIN | RESIN | RESIN | RESIN | RESIN |
| THICKNESS OF SOLDER LAYER | 18 μm ON ONE SIDE | 18 μm ON ONE SIDE | 18 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |
| COMPOSITION OF SOLDER LAYER | SnSb | SnSb | SnSb | SnSb | SnSb | SnSb | SnSb | SnSb | SnSb |
| THICKNESS OF Sn LAYER (μm) | 0.1 | 0.5 | 6 | 0.1 | 0.5 | 12 | 0.1 | 0.23 | 0.36 |
| Sn LAYER:SOLDER LAYER | 0.556 | 2.778 | 33.333 | 0.263 | 1.316 | 31.579 | 10.000 | 23.000 | 36.000 |
| YELLOWNESS | ○ | ○ | ○ | ○ | ○ | ○ | ○ | ○ | ○ |
| DEFECT AT THE TIME OF BONDING | ○ | ○ | ○ | ○ | ○ | ○ | ○ | ○ | ○ |

TABLE 32

|  | COMPARATIVE EXAMPLE 136 | COMPARATIVE EXAMPLE 137 | COMPARATIVE EXAMPLE 138 | COMPARATIVE EXAMPLE 139 | COMPARATIVE EXAMPLE 140 | COMPARATIVE EXAMPLE 141 | COMPARATIVE EXAMPLE 142 | COMPARATIVE EXAMPLE 143 | COMPARATIVE EXAMPLE 144 |
|---|---|---|---|---|---|---|---|---|---|
| CORE MATERIAL | RESIN | RESIN | RESIN | RESIN | RESIN | RESIN | RESIN | RESIN | RESIN |
| THICKNESS OF SOLDER LAYER | 18 μm ON ONE SIDE | 18 μm ON ONE SIDE | 18 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |
| COMPOSITION OF SOLDER LAYER | SnSb | SnSb | SnSb | SnSb | SnSb | SnSb | SnSb | SnSb | SnSb |
| THICKNESS OF Sn LAYER (μm) | 0 | 0.03 | 10 | 0 | 0.03 | 15 | 0 | 0.002 | 0.5 |
| Sn LAYER:SOLDER LAYER | 0.000 0:100 | 0.167 LESS THAN LOWER LIMIT VALUE | 55.556 EXCEEDING UPPER LIMIT VALUE | 0.000 0:100 | 0.079 LESS THAN LOWER LIMIT VALUE | 39.474 EXCEEDING UPPER LIMIT VALUE | 0.000 0:100 | 0.200 LESS THAN LOWER LIMIT VALUE | 50.000 EXCEEDING UPPER LIMIT VALUE |
| YELLOWNESS | X | X | ○ | X | X | ○ | X | X | ○ |
| DEFECT AT THE TIME OF BONDING | ○ | ○ | X | ○ | ○ | X | ○ | ○ | X |

TABLE 33

|  | EXAMPLE 145 | EXAMPLE 146 | EXAMPLE 147 | EXAMPLE 148 | EXAMPLE 149 | EXAMPLE 150 | EXAMPLE 151 | EXAMPLE 152 | EXAMPLE 153 |
|---|---|---|---|---|---|---|---|---|---|
| CORE MATERIAL | RESIN | RESIN | RESIN | RESIN | RESIN | RESIN | RESIN | RESIN | RESIN |
| THICKNESS OF SOLDER LAYER | 18 μm ON ONE SIDE | 18 μm ON ONE SIDE | 18 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |
| COMPOSITION OF SOLDER LAYER | SnIn | SnIn | SnIn | SnIn | SnIn | SnIn | SnIn | SnIn | SnIn |
| THICKNESS OF Sn LAYER (μm) | 0.1 | 0.5 | 6 | 0.1 | 0.5 | 12 | 0.1 | 0.23 | 0.36 |
| Sn LAYER:SOLDER LAYER | 0.556 | 2.775 | 33.333 | 0.263 | 1.316 | 31.579 | 10.000 | 23.000 | 36.000 |
| YELLOWNESS | ○ | ○ | ○ | ○ | ○ | ○ | ○ | ○ | ○ |
| DEFECT AT THE TIME OF BONDING | ○ | ○ | ○ | ○ | ○ | ○ | ○ | ○ | ○ |

TABLE 34

|  | COMPARATIVE EXAMPLE 145 | COMPARATIVE EXAMPLE 146 | COMPARATIVE EXAMPLE 147 | COMPARATIVE EXAMPLE 148 | COMPARATIVE EXAMPLE 149 | COMPARATIVE EXAMPLE 150 | COMPARATIVE EXAMPLE 151 | COMPARATIVE EXAMPLE 152 | COMPARATIVE EXAMPLE 153 |
|---|---|---|---|---|---|---|---|---|---|
| CORE MATERIAL | RESIN | RESIN | RESIN | RESIN | RESIN | RESIN | RESIN | RESIN | RESIN |
| THICKNESS OF SOLDER LAYER | 18 μm ON ONE SIDE | 18 μm ON ONE SIDE | 18 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |
| COMPOSITION OF SOLDER LAYER | SnIn | SnIn | SnIn | SnIn | SnIn | SnIn | SnIn | SnIn | SnIn |
| THICKNESS OF Sn LAYER (μm) | 0 | 0.03 | 10 | 0 | 0.03 | 15 | 0 | 0.002 | 0.5 |
| Sn LAYER:SOLDER LAYER | 0.000 0:100 | 0.167 LESS THAN LOWER LIMIT VALUE | 55.556 EXCEEDING UPPER LIMIT VALUE | 0.000 0:100 | 0.079 LESS THAN LOWER LIMIT VALUE | 39.474 EXCEEDING UPPER LIMIT VALUE | 0.000 0:100 | 0.200 LESS THAN LOWER LIMIT VALUE | 50.000 EXCEEDING UPPER LIMIT VALUE |
| YELLOWNESS | X | X | ○ | X | X | ○ | X | X | ○ |
| DEFECT AT THS TIME OF BONDING | ○ | ○ | X | ○ | ○ | X | ○ | ○ | X |

TABLE 35

|  | EXAMPLE 154 | EXAMPLE 155 | EXAMPLE 156 | EXAMPLE 157 | EXAMPLE 158 | EXAMPLE 159 | EXAMPLE 160 | EXAMPLE 161 | EXAMPLE 162 |
|---|---|---|---|---|---|---|---|---|---|
| CORE MATERIAL | RESIN | RESIN | RESIN | RESIN | RESIN | RESIN | RESIN | RESIN | RESIN |
| THICKNESS OF SOLDER LAYER | 18 μm ON ONE SIDE | 18 μm ON ONE SIDE | 18 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |
| COMPOSITION OF SOLDER LAYER | SnPb | SnPb | SnPb | SnPb | SnPb | SnPb | SnPb | SnPb | SnPb |
| THICKNESS OF Sn LAYER (μm) | 0.1 | 0.5 | 6 | 0.1 | 0.5 | 12 | 0.1 | 0.23 | 0.36 |
| Sn LAYER:SOLDER LAYER | 0.556 | 2.778 | 33.333 | 0.263 | 1.316 | 31.579 | 10.000 | 23.000 | 36.000 |
| YELLOWNESS | ○ | ○ | ○ | ○ | ○ | ○ | ○ | ○ | ○ |
| DEFECT AT THE TIME OF BONDING | ○ | ○ | ○ | ○ | ○ | ○ | ○ | ○ | ○ |

TABLE 36

|  | COMPARATIVE EXAMPLE 154 | COMPARATIVE EXAMPLE 155 | COMPARATIVE EXAMPLE 156 | COMPARATIVE EXAMPLE 157 | COMPARATIVE EXAMPLE 158 | COMPARATIVE EXAMPLE 159 | COMPARATIVE EXAMPLE 160 | COMPARATIVE EXAMPLE 161 | COMPARATIVE EXAMPLE 162 |
|---|---|---|---|---|---|---|---|---|---|
| CORE MATERIAL | RESIN | RESIN | RESIN | RESIN | RESIN | RESIN | RESIN | RESIN | RESIN |
| THICKNESS OF SOLDER LAYER | 18 μm ON ONE SIDE | 18 μm ON ONE SIDE | 18 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |
| COMPOSITION OF SOLDER LAYER | SnPb | SnPb | SnPb | SnPb | SnPb | SnPb | SnPb | SnPb | SnPb |
| THICKNESS OF Sn LAYER (μm) | 0 | 0.03 | 10 | 0 | 0.03 | 15 | 0 | 0.002 | 0.5 |
| Sn LAYER:SOLDER LAYER | 0.000 0:100 | 0.167 LESS THAN LOWER LIMIT VALUE | 55.556 EXCEEDING UPPER LIMIT VALUE | 0.000 0:100 | 0.079 LESS THAN LOWER LIMIT VALUE | 39.474 EXCEEDING UPPER LIMIT VALUE | 0.000 0:100 | 0.200 LESS THAN LOWER LIMIT VALUE | 50.000 EXCEEDING UPPER LIMIT VALUE |
| YELLOWNESS | X | X | ○ | X | X | ○ | X | X | ○ |
| DEFECT AT THE TIME OF BONDING | ○ | ○ | X | ○ | ○ | X | ○ | ○ | X |

The present embodiment also provides a method for forming a bump electrode, the method including the steps of: mounting a core material on an electrode; and forming the bump electrode by heating the mounted core material.

The shape of the core material also includes not only a spherical body but also a columnar column and a sheet and the like. For example, a core column in which a Ni base plating layer and Co base plating layer and the like of 1 to 4 μm on one side are provided on the surface of a Cu column having diameters of top and bottom surfaces of 1 to 1000 μm and a height of 1 to 3000 μm, and in the same condition as that of Examples, the Cu column is covered with a solder plating layer can provide the same effects as those in Examples described above, and good results could be obtained in each of yellowness and a defect at the time of bonding.

As an example, the results of using an aspect in which a column having a diameter φ of 0.30 mm and a height of 0.53 mm is used and the Ni plating thickness is 2 μm on one side are shown below. The thickness of the solder layer is a value not including the Ni plating thickness.

TABLE 37

|  | EXAMPLE 163 | EXAMPLE 164 | EXAMPLE 165 | EXAMPLE 166 | EXAMPLE 167 | EXAMPLE 168 | EXAMPLE 169 | EXAMPLE 170 | EXAMPLE 171 |
|---|---|---|---|---|---|---|---|---|---|
| CORE MATERIAL | COPPER | COPPER | COPPER | COPPER | COPPER | COPPER | COPPER | COPPER | COPPER |
| THICKNESS OF SOLDER LAYER | 5.5 μm ON ONE SIDE | 5.5 μm ON ONE SIDE | 5.5 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |
| COMPOSITION OF SOLDER LAYER | SAC305 | SAC305 | SAC305 | SAC305 | SAC305 | SAC305 | SAC305 | SAC305 | SAC305 |
| THICKNESS OF Sn LAYER (μm) | 0.1 | 0.5 | 1.8 | 0.1 | 0.5 | 12 | 0.1 | 0.23 | 0.36 |
| Sn LAYER:SOLDER LAYER | 1.818 | 9.091 | 32.727 | 0.263 | 1.316 | 31.579 | 10.000 | 23.000 | 36.000 |
| YELLOWNESS | ○ | ○ | ○ | ○ | ○ | ○ | ○ | ○ | ○ |
| DEFECT AT THE TIME OF BONDING | ○ | ○ | ○ | ○ | ○ | ○ | ○ | ○ | ○ |

TABLE 38

|  | COMPARATIVE EXAMPLE 163 | COMPARATIVE EXAMPLE 164 | COMPARATIVE EXAMPLE 165 | COMPARATIVE EXAMPLE 166 | COMPARATIVE EXAMPLE 167 | COMPARATIVE EXAMPLE 168 | COMPARATIVE EXAMPLE 169 | COMPARATIVE EXAMPLE 170 | COMPARATIVE EXAMPLE 171 |
|---|---|---|---|---|---|---|---|---|---|
| CORE MATERIAL | COPPER | COPPER | COPPER | COPPER | COPPER | COPPER | COPPER | COPPER | COPPER |
| THICKNESS OF SOLDER LAYER | 5.5 μm ON ONE SIDE | 5.5 μm ON ONE SIDE | 5.5 μm ON ONE SIDE | 38 μm ON ONE SIDE | 38 μm ON ONE SIDE | 38 μm ON ONE SIDE | 1 μm ON ONE SIDE | 1 μm ON ONE SIDE | 1 μm ON ONE SIDE |
| COMPOSITION OF SOLDER LAYER | SAC305 | SAC305 | SAC305 | SAC305 | SAC305 | SAC305 | SAC305 | SAC305 | SAC305 |
| THICKNESS OF Sn LAYER (μm) | 0 | 0.01 | 2.5 | 0 | 0.03 | 15 | 0 | 0.002 | 0.5 |

TABLE 38-continued

| | COMPARATIVE EXAMPLE 163 | COMPARATIVE EXAMPLE 164 | COMPARATIVE EXAMPLE 165 | COMPARATIVE EXAMPLE 166 | COMPARATIVE EXAMPLE 167 | COMPARATIVE EXAMPLE 168 | COMPARATIVE EXAMPLE 169 | COMPARATIVE EXAMPLE 170 | COMPARATIVE EXAMPLE 171 |
|---|---|---|---|---|---|---|---|---|---|
| Sn LAYER:SOLDER LAYER | 0.000 0:100 | 0.182 LESS THAN LOWER LIMIT VALUE | 45.455 EXCEEDING UPPER LIMIT VALUE | 0.000 0:100 | 0.079 LESS THAN LOWER LIMIT VALUE | 39.474 EXCEEDING UPPER LIMIT VALUE | 0.000 0:100 | 0.200 LESS THAN LOWER LIMIT VALUE | 50.000 EXCEEDING UPPER LIMIT VALUE |
| YELLOWNESS | X | X | ○ | X | X | ○ | X | X | ○ |
| DEFECT AT THE TIME OF BONDING | ○ | ○ | X | ○ | ○ | X | ○ | ○ | X |

The description of the embodiments, the description of Examples, and the disclosure of the drawings described above are merely examples for describing the invention described in claims. The invention described in claims is not limited by the description of the embodiments or the disclosure of the drawings described above.

EXPLANATION OF REFERENCE

10 Cu core ball
12 Core
14 Base plating layer
16 Solder plating layer (solder layer)
20 Sn plating layer (Sn layer)

What is claimed is:

1. A core material comprising:
   a core;
   a solder layer provided outside the core and being a solder alloy containing only Sn and at least any one element of Ag, Cu, Sb, Ni, Co, Ge, Ga, Fe, Al, In, Cd, Zn, Pb, Au, P, S, Si, Ti, Mg, Pd, and Pt; and
   a Sn plating layer provided outside the solder layer, wherein
   the solder layer has a thickness of 1 μm or more on one side,
   the Sn plating layer has a thickness of 0.1 μm or more on one side, and
   a thickness of the Sn plating layer is 0.215% or more and 36% or less of the thickness of the solder layer.

2. The core material according to claim 1, wherein the solder layer is a (Sn-Ag-Cu)-based solder.

3. The core material according to claim 1, further comprising a base plating layer made of any one of Ni, Co, Ni—Co, Ni—P and Ni—B between the core and the solder layer.

4. The core material according to claim 1, wherein Cu ball or Cu column is used as the core.

5. An electronic component using the core material according to claim 1 as a solder bump.

6. A method for forming bump electrode comprising steps of:
   mounting the core material according to claim 1 on an electrode;
   forming a bump electrode by heating the mounted core material.

7. The core material according to claim 1, wherein the Sn plating layer is an outermost layer.

* * * * *